United States Patent
Hayashizaki et al.

(10) Patent No.: US 10,361,569 B2
(45) Date of Patent: Jul. 23, 2019

(54) POWER STORAGE SERVICE SYSTEM

(71) Applicant: YOKOGAWA ELECTRIC CORPORATION, Tokyo (JP)

(72) Inventors: Hironori Hayashizaki, Tokyo (JP); Satoshi Yoshitake, Tokyo (JP); Ryuuta Tanaka, Tokyo (JP); Jun Murai, Fujisawa (JP); Hideaki Horie, Fujisawa (JP)

(73) Assignee: Yokogawa Electric Corporation, Musashino-shi, Tokyo (JP)

( * ) Notice: Subject to any disclaimer, the term of this patent is extended or adjusted under 35 U.S.C. 154(b) by 230 days.

(21) Appl. No.: 15/377,228

(22) Filed: Dec. 13, 2016

(65) Prior Publication Data
US 2017/0170668 A1    Jun. 15, 2017

(30) Foreign Application Priority Data
Dec. 15, 2015 (JP) .................. 2015-244220

(51) Int. Cl.
*H02J 7/00* (2006.01)
*H02J 7/14* (2006.01)
(Continued)

(52) U.S. Cl.
CPC ........ *H02J 7/0016* (2013.01); *G01R 31/3832* (2019.01); *G01R 31/396* (2019.01);
(Continued)

(58) Field of Classification Search
USPC .................. 320/136, 119, 134, 135, 132
See application file for complete search history.

(56) References Cited

U.S. PATENT DOCUMENTS

| 4,377,787 A | 3/1983 | Kikuoka et al. |
| 6,417,668 B1 * | 7/2002 | Howard ................ H02J 7/1461 324/426 |

(Continued)

FOREIGN PATENT DOCUMENTS

| EP | 1 536 540 A2 | 6/2005 |
| JP | 56-28476 A | 3/1981 |

(Continued)

*Primary Examiner* — Alexis B Pacheco
(74) *Attorney, Agent, or Firm* — Sughrue Mion, PLLC

(57) ABSTRACT

The present invention is a power storage service system including: quantitatively grasping the time leading up to the expression of the abnormality; capable determining possible or impossible of avoiding stopping of the function of the assembled battery system. According to the invention, a maintenance operator and a maintenance service supplier of the assembled battery system have a time margin to plan a response schedule and to prepare responding, and it can reduce the cost of responding to the maintenance by reducing and optimizing the number of response.

One aspect of the present invention is a power storage service system configured to control a power system using an assembled battery system including a plurality of unit cells, the power storage service system including: a first measurer configured to measure a self-discharge current difference among the plurality of the unit cells; and a second measurer configured to obtain a residual time of the assembled battery using the self-discharge current difference measured by the first measurer.

19 Claims, 12 Drawing Sheets

(51) Int. Cl.
*G01R 31/396* (2019.01)
*G01R 31/3832* (2019.01)
*H01M 10/42* (2006.01)
*H01M 10/48* (2006.01)
*G01R 19/165* (2006.01)

(52) U.S. Cl.
CPC ....... H01M 10/4207 (2013.01); H01M 10/48 (2013.01); H01M 10/482 (2013.01); H01M 10/486 (2013.01); H02J 7/007 (2013.01); H02J 7/0011 (2013.01); H02J 7/0021 (2013.01); H02J 7/0026 (2013.01); *G01R 19/16542* (2013.01)

(56) References Cited

U.S. PATENT DOCUMENTS

| | | | | |
|---|---|---|---|---|
| 2005/0046392 | A1* | 3/2005 | Yamada | G01R 31/3648 320/149 |
| 2005/0112416 | A1* | 5/2005 | Sakakibara | H02J 7/0014 429/9 |
| 2011/0223492 | A1* | 9/2011 | Sakitani | H01M 4/13 429/339 |
| 2013/0082517 | A1* | 4/2013 | Kawai | B60R 16/033 307/9.1 |
| 2013/0335030 | A1* | 12/2013 | Joe | H01M 10/052 320/134 |
| 2014/0154535 | A1* | 6/2014 | Olsson | H01M 2/1264 429/53 |
| 2014/0217982 | A1* | 8/2014 | Ohkawa | H02J 7/0016 320/118 |
| 2014/0292072 | A1* | 10/2014 | Nakanishi | B60L 11/1851 307/9.1 |
| 2015/0069973 | A1* | 3/2015 | Yoshida | B60L 11/1864 320/118 |
| 2015/0340888 | A1* | 11/2015 | Hofer | H01M 10/425 320/116 |
| 2016/0294185 | A1* | 10/2016 | Al-Mohssen | G05B 13/026 |
| 2016/0370125 | A1* | 12/2016 | Gilbert | H02J 15/00 |
| 2017/0077731 | A1* | 3/2017 | Miyazaki | H01M 10/0445 |

FOREIGN PATENT DOCUMENTS

| | | |
|---|---|---|
| JP | 11-40209 A | 2/1999 |
| JP | 2004-191150 A | 7/2004 |
| JP | 2007-187533 A | 7/2007 |
| JP | 3975796 B2 | 9/2007 |
| JP | 4529246 B2 | 8/2010 |
| JP | 2014-510262 A | 4/2014 |
| WO | 2012/099866 A2 | 7/2012 |

* cited by examiner

| # | MEASUREMENT TIME | UNIT CELL 1 | UNIT CELL 2 | ... | UNIT CELL M |
|---|---|---|---|---|---|
| 1 | 2014/01/12 08:00:00 | 5.13Ah | 6.13Ah | ... | 3.66Ah |
| 2 | 2014/01/26 08:00:00 | 8.02Ah | 8.28Ah | ... | 9.03Ah |
| 3 | 2014/02/09 08:00:00 | 6.56Ah | 8.02Ah | ... | 9.29Ah |
| N-2 | $T_{n-2}$ | 17.93Ah | 18.19Ah | ... | 19.06Ah |
| N-1 | $T_{n-1}$ | 13.34Ah | 13.61Ah | ... | 14.59Ah |
| N | $T_n$ | 16.36Ah | 16.19Ah | ... | 17.65Ah |

FIG. 11

| MAINTENANCE PLAN TABLE ||||||||
|---|---|---|---|---|---|---|
| # | MAINTENANCE SCHEDULE | DAYS | TYPE | LOCATION | FIELD OPERATOR | PARTS |
| 1 | 2014/02/01 | 1 | ONE YEAR INSPECTION | SITE A | FIELD OPERATOR 1, FIELD OPERATOR 3 | PARTS 1, PARTS 2 |
| 2 | 2014/02/02 | 2 | ONE YEAR INSPECTION | SITE B | FIELD OPERATOR 2 | PARTS 1 |
| 3 | 2014/02/02 | 1 | EMERGENCY | SITE C | FIELD OPERATOR 1 | PARTS 3 |
| | | | | | | |
| N | 2014/05/01 | 3 | FIVE YEARS INSPECTION | SITE D | FIELD OPERATOR 2, FIELD OPERATOR 3 | PARTS 1, PARTS 2 |

MAINTENANCE SERVICE PROVIDED CUSTOMER AVAILABLE DATE OF THE MAINTENANCE | OPERATOR ARRANGEMENT TABLE | PARTS ARRANGEMENT TABLE

| # | UPPER LIMIT VALUE | LOWER LIMIT VALUE |
|---|---|---|
| 1 | 30Ah | 70Ah |
| 2 | 20Ah | 80Ah |
| 3 | 10Ah | 90Ah |
|  |  |  |
| N | 20Ah | 50Ah |

POWER STORAGE SERVICE SYSTEM

BACKGROUND OF THE INVENTION

Field of the Invention

The present invention relates to a power storage service system.

Priority is claimed on Japanese Patent Application No. 2015-244220, filed Dec. 15, 2015, the contents of which are incorporated herein by reference.

Description of Related Art

An assembled battery system classified for a large stationary generally has a storage capacity of several hundreds of kWh or an input and output power capacity of more than several tens of kW. In recent years, it began to be assumed that a system with a storage capacity of 100 MWh class. A large capacity is to generally realize by combining hundreds to thousands pieces of unit cells of a several tens to several hundred Ah.

In such as the assembled battery system, it has been made to monitor state of unit cells by using operation state information of an equalization circuit. The assembled battery system is described in Patent Document 1 (Japanese Patent No. 4529246), and Patent Document 2 (Japanese Patent No. 3975796).

An abnormality detector of the assembled battery described in Patent Document 1 determines the abnormality of the assembled battery based on the operation frequency of the capacitance equalizer to achieve the equalization of the remaining capacities of the plurality of unit cells (SOC). There is judged to be abnormal when the operation frequency larger than or equal to at least a predetermined frequency. Further, an abnormality detector of the assembled battery described in Patent Document 2 determines an abnormality of the assembled battery based on the discharge quantity of the capacity equalization means to achieve the equalization of the remaining capacities of the plurality of unit cells (SOC), the unit cell which the discharge quantity is less than predetermined threshold value is determined that it is the unit cell which is not able to charge a sufficient electric quantity because of its deterioration is determined to be abnormal.

The abnormality detector of the assembled battery described in Patent Document 1 merely determines an abnormality, and it is impossible to know the time margin until the abnormality is occurred. The abnormality detector of the assembled battery described in Patent Document 2 can avoid the problem that the unit cells are determined abnormal in accordance with an equalization circuit operates even though the unit cells are normal in a case that the small discharge is repeatedly executed. But it is merely determination of the abnormality, it is also impossible to know the time margin until the abnormality is occurred. The installed assembled battery system is in the trend of the market which the storage capacity is required for increasing in the future, it is apparent that the number of the unit cells are increased. In the prior art, it needs to stop the system in each occurring the abnormality, and it needs to confirm the state of the system and perform the maintenance task. It is clear that the operating time of the assembled battery system will decrease, unless the abnormal incidence of the unit cells is significantly improved.

Further, when the abnormality is occurred in the installed assembled battery system, it is extremely important to safely stop the actual operation for the system itself and the service which is given power from the system, to launch alternatives, and to secure time for arranging repair parts and secure maintenance operators, even though the unit cell is irreversible deteriorated (e.g., over discharge). However, the prior art does not disclose a mechanism that can be measured and securing of the time.

If it cannot solve the above mentioned problems, it is impossible for the power company who adopts a KPI (Key Performance Indicator) derived from a SAIDI (annual average power failure time per subscriber) and a SAIDI (annual average number of power failures per subscriber) to pull out the original utility from the assembled battery system that is introduced for the KPI improvement.

On the other hand, it is well known that the quality improvement efforts is carried out every day such as reducing an uneven of the product, adding of the inspection processes, and the pre-shipment screening for the purpose of reducing the probability of the occurring abnormality due to the characteristics of the unit cells. However, all these matters also lead to an increasing of the manufacturing cost and profitability of one or more of unit cell manufacturers, assembled battery system manufacturers, and the user of assembled battery system are deteriorated. In addition, it is impossible to completely eliminate probability of the abnormal expression risk in the quality control of the manufacturing process, to lead the risk to zero. It is obvious that the abnormality is expressed with a certain probability. Thus, there are necessaries to manage the abnormal expression risk in the assembled battery system side which includes the unit cells.

The present invention is a power storage service system including: quantitatively grasping the time leading up to the expression of the abnormality; capable determining possible or impossible of avoiding stopping of the function of the assembled battery system. According to the invention, a maintenance operator and a maintenance service supplier of the assembled battery system have a time margin to plan a response schedule and to prepare responding, and it can reduce the cost of responding to the maintenance by reducing and optimizing the number of response.

SUMMARY

One aspect of the present invention is a power storage service system configured to control a power system using an assembled battery system including a plurality of unit cells, including: a first measurer configured to measure a self-discharge current difference between the plurality of the unit cells; and a second measurer configured to obtain a residual time of the assembled battery using the self-discharge current difference measured by the first measurer.

One aspect of the present invention is the power storage service system further including: a third measurer configured to measure a residual capacity of the each of the unit cells and to output a residual capacity measurement value; a residual capacity equalizer configured to determine a targeted residual capacity based on the residual capacity of the each of the unit cells obtained by the third measurer, to adjust the residual capacity of the each of the unit cells to the targeted residual capacity, and to output the adjusted residual capacity as a residual capacity equalization value; a time stamper configured to record at least an operation starting time, an operation ending time, and a measuring time of the residual capacity, of the residual capacity equalizer as a time stamp result; a time stamp result storage configured to store the time stamp result recorded by the time stamper; a current value detector configured to detect a current value of the assembled battery system and output the current value as a residual capacity equalization current value; a current value storage configured to store the residual capacity equalization current value obtained from the current value detector; a first obtainer configured to obtain a equalization adjustment quantity for equalizing the residual capacity of the each of the unit cells using the residual capacity equalization current value obtained from the third measurer, the time stamp result stored in the time stamp result storage, and the residual capacity equalization current value stored in the current value storage; and a second obtainer configure to obtain the self-discharge current difference from the residual capacity measurement value obtained from the third measurer, the time stamp result stored in the time stamp result storage, and the equalization adjustment quantity obtained from the first obtainer.

One aspect of the present invention is the power storage service system further including: a fourth measurer configured to measure a voltage of each of the unit cells; wherein the third measurer detects the residual capacity of the unit cell by using a first differential characteristic curve of the voltage value of the unit cell measured by the fourth measurer and the current value of the assembled battery measured by the current detector, a second differential characteristic curve as a criterion, and an optimization function.

One aspect of the present invention is the power storage service system, wherein the first obtainer integrates the residual capacity equalization current value based on the operation starting time and the operation ending time stored in the time stamper.

One aspect of the present invention is the power storage service system, wherein the second obtainer obtains the self-discharge current difference based on a value obtained from the residual capacity of the unit cell measured by the third measurer by using a calculation method including at least a maximum value, a minimum value, an average value, and a multiplication of a coefficient.

One aspect of the present invention is the power storage service system, wherein the second obtainer obtains the self-discharge current value based on the residual capacity measured value of at least the one unit cell obtained from the third measurer.

One aspect of the present invention is the power storage service system, further including: a residual capacity limit value setter configured to set an upper limit value and a lower limit value of the residual capacity measurement value obtained from the third measurer; and a residual capacity limiter configured to store the upper limit value and the lower limit value of the residual capacity measurement value set by the residual capacity limit value setter.

One aspect of the present invention is the power storage service system, wherein the second measurer further including: a third obtainer configured to obtain a time required for an additional operation of the residual capacity equalizer by using the self-discharge current difference, the residual capacity equalization current value, and the residual capacity, in a case that a sum of the self-discharge current value obtained from the second obtainer and the residual capacity equalization current value stored in the current value storage is positive; and a fourth obtainer configured to obtain the residual time of the assembled battery system by using a limit range, the self-discharge current difference, the residual capacity equalization current value, and the residual capacity, in a case that the sum of the self-discharge current value and the residual capacity equalization current value is negative.

One aspect of the present invention is the power storage service system, wherein the second measurer further including: a battery state value output unit configured to output a current state value indicating that the self-discharge current difference is expanding if a ratio of an absolute value of the self-discharge current value to the residual capacity equalization current value is larger than or equal to a predetermined ratio.

One aspect of the present invention is the power storage service system, wherein the second measurer further including: a battery state value output unit configured to output a current state value indicating that the self-discharge current difference is normal if a ratio of an absolute value of the self-discharge current value to the residual capacity equalization current value is smaller than a predetermined ratio.

One aspect of the present invention is the power storage service system, wherein the second measurer further including: a battery state value output unit configured to output a current state value indicating that a non-stationary maintenance service is required if the residual time obtained by the fourth obtainer is less than a residual time until a predetermined maintenance service time.

One aspect of the present invention is the power storage service system, wherein the residual capacity limiter decreases a residual capacity lower limit value based on a setting of the residual time expanding signal for expanding a time until the effective SOC range of the assembled battery system is zero.

One aspect of the present invention is the power storage service system, wherein the residual capacity limiter increases a residual capacity upper limit value based on a setting of the residual time expanding signal for expanding a time until the effective SOC range of the assembled battery system is zero.

One aspect of the present invention is the power storage service system, further including: a device configured to change either the residual capacity lower limit value or the residual capacity upper limit value, or both of the residual capacity lower limit value and the residual capacity upper limit value based on a residual time expanding signal for expanding a time until the effective SOC range of the assembled battery system is zero, to re-obtain the residual time and update a battery state value.

One aspect of the present invention is the power storage service system, further including: a physical quantity measurer configured to measure a temperature of the unit cell if a ratio of the self-discharge current difference measured by the first measurer to the equalization current value is larger than or equal to a predetermined ratio; and a first determiner configured to compare a temperature of the unit cell of which the self-discharge current difference is large with a temperature of the unit cell which is a criterion for obtaining the self-discharge current difference or an average temperature, to determine the temperature of the unit cell of which the self-discharge current difference is larger than the temperature of the unit cell which is the criterion or the average temperature, and to output a signal representing that a measurement of the self-discharge current difference is normal.

One aspect of the present invention is the power storage service system, wherein the first measurer further including: a physical quantity measurer configured to measure a dilatation of the external form of the unit cell if a ratio of the self-discharge current value to the equalization current value is larger than or equal to a predetermined ratio; a first determiner configured to compare a dilatation of the unit cell of which the self-discharge current difference is large with a dilatation of the unit cell which is a criterion for obtaining the self-discharge current difference or an average dilatation, to determine the dilatation of the unit cell of which the self-discharge current difference is larger than the dilatation of the unit cell which is the criterion or the average dilatation, and to output a signal representing that a measurement of the self-discharge current difference is normal.

One aspect of the present invention is the power storage service system, wherein the first measurer further includes a display configured to display a measurement result trend of the self-discharge current difference.

One aspect of the present invention is the power storage service system, further including: a device configured to monitor remotely the current state value via a communication line including at least the internet.

One aspect of the present invention is the power storage service system, further including: a maintenance service business system configured to provide a residual time expanding signal for expanding a time until the effective SOC range of the assembled battery system is zero to the residual capacity limit value setter by using the battery state value, the residual time, the self-discharge current difference, and a physical quantity which is a physical quantity for detecting an abnormal state of the unit cell, to plan a maintenance schedule of the assembled battery, and to implement a maintenance operation.

As described above, according to the present invention, it is capable of providing a power storage service system that quantitatively grasps a time to occur an abnormality, it is capable of determining whether or not to avoid stopping the function of the assembled battery, it gives a time margin to a maintenance operator and a maintenance service supplier of the assembled battery to plan a maintenance schedule and a preparation for maintenance, and it is capable of providing the power storage service system capable of reducing a maintenance cost by reducing a number of maintenance and optimization.

BRIEF DESCRIPTION OF THE DRAWINGS

FIG. 11 is a diagram showing an example of a maintenance plan according to an embodiment of the present invention.

DETAILED DESCRIPTION OF THE INVENTION

Figure 1A:
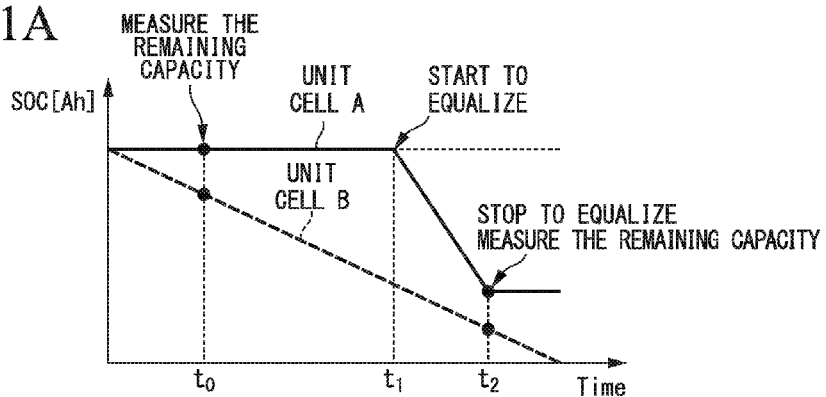
FIGS. 1A-1C are diagrams for explaining detecting a state of a battery according to an embodiment of the present invention.
Figure 1B:
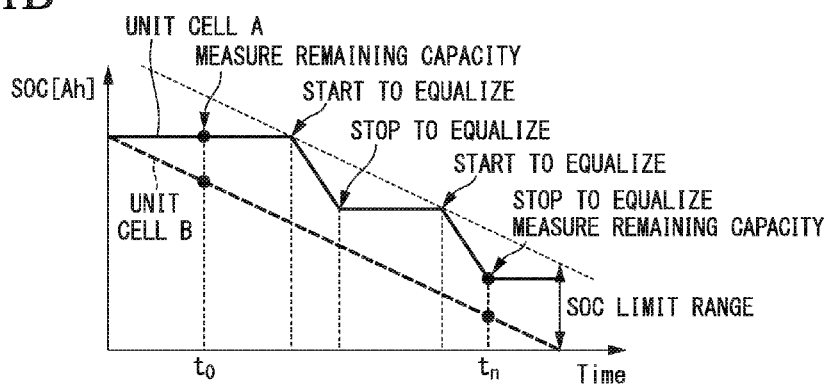
Figure 1C:
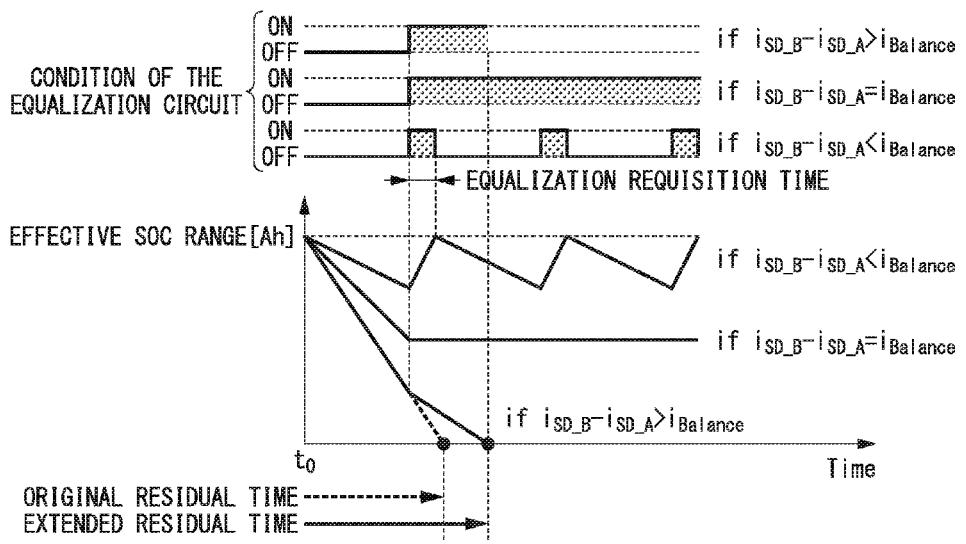

Hereinafter, a power storage service system in this embodiment will be described with reference to the drawings. Firstly, the embodiment of the present invention relates to the power storage service system controlling an electric power system using an assembled battery system including a plurality of unit cells. The embodiment of the present invention, in other words, relates to the power storage service system which detects battery state by comparing between self-discharge current difference of a plurality of unit cells and equalization current of an equalization circuit. The embodiment will be described with reference to FIG. 1 (FIG. 1(A) to FIG. 1(C)). FIG. 1 is a diagram for explaining detecting a state of a unit cell according to an embodiment of the present invention. FIG. 1(A) is a diagram showing a temporal change of a residual capacity in a case of executing residual capacity equalization in one time in the present embodiment. FIG. 1(B) is a diagram showing a temporal change of residual capacity in a case of executing residual capacity equalization in plural times in the present embodiment. FIG. 1(C) is a diagram showing a temporal change of an effective SOC range and a state of an equalization circuit at the time in the present embodiment.

The reason why a using frequency and a usage time of the equalization circuit in an assembled battery (assembled battery system) increase is that a self-discharge which one or more particular unit cells in the assembled battery is larger than another unit cells in the assembled battery, and a difference of self-discharge between the particular unit cells and the other unit cells is large. FIG. 1(A) and FIG. 1(B) shows a principle of obtaining a difference of the self-discharge between the unit cells. The residual capacity is obtained as a counter value which an electric quantity required from a measurement of a charging and discharging current of the unit cell using a current sensor is integrated. However, the self-discharge generated in interior of the unit cell cannot be counted. Therefore, the error of the residual capacity increases with the lapse of time. Therefore, using the measuring method using the differential characteristics of the voltage and the current, the residual capacity of which the integrated error of the current sensor and the error due to the self-discharge are measured. Above noted techniques are described in Japanese Patent Application No. 2014-177268 and Japanese Patent Application No. 2015-103851 filed by the applicant of the present application are known. In the present embodiment, the residual capacity represents a residual quantity of dischargeable electric quantity in the battery. The residual capacity is also referred to as a SOC (State Of Charge). The residual capacity has a unit such as percentage and Ah, Wh. The unit cell (hereinafter, referred to as a unit cell A) is a criterion for obtaining a difference of a self-discharge. A residual capacity difference of the unit cell of which the self-discharge is large (hereinafter, referred to as a unit cell B) is obtained by subtracting adjustment quantity $i_{Balance}$ by the equalization circuit from difference (SOCB−SOCA) between the residual capacity of the unit cell B and the residual capacity of the unit cell A using the result of the residual capacity measurement using differential characteristics. That is, using the following formula, the difference of the residual capacity in t2 is obtained as a value obtained by subtracting the self-discharge quantity and the adjustment quantity of the equalization from the residual capacity measurement at t0 shown in FIG. 1(A).

$$SOCB(t2) - SOCA(t2) = [SOCB(t0) - i_{SD\_B}(t2 - t0)] -$$
$$[SOCA(t1) - i_{Balance}(t2 - t1) - i_{SD\_A}(t2 - t1)]$$
$$= [SOCB(t0) - i_{SD\_B}(t2 - t0)] -$$
$$[SOCA(t0) - i_{Balance}(t2 - t1) - i_{SD\_A}(t2 - t0)]$$

Even if the equalization of the residual capacity was carried out multiple times, it is possible to detect the self-discharge current difference by knowing the adjustment quantity of them. FIG. 1(B) shows an example in which plural times of equalization is executed so that the residual capacity difference is not exceeded to the SOC limit range between t0 and tn. The SOC limit range is the range of the residual capacity that is allowed charging and discharging. The SOC limit range is restricted by an upper limit value and a lower limit value of the residual capacity. The self-discharge current difference ($i_{SD\_A} - i_{SD\_B} \equiv i_{SD}$) is obtained by following equation.

$$i_{SD\_A} - i_{SD\_B} = \left\{ \begin{array}{l} [SOCB(t2) - SOCA(t2)] - \\ [SOCB(t0) - SOCA(t0)] - i_{Balance} \cdot (t2 - t1) \end{array} \right\} / (t2 - t1)$$
$$= \left\{ \begin{array}{l} [SOCB(tn) - SOCA(tn)] - \\ [SOCB(t0) - SOCA(t0)] - \sum [i_{Balance}(t) \cdot dt] \end{array} \right\} / (tn - t0)$$

The battery state is detected by comparing the self-discharge current difference and the equalization current of the equalization circuit. If the self-discharge current difference is smaller than the equalization current i (if $i_{SD\_B} - i_{SD\_A} < i_{Balance}$), the residual capacity is determined to be in state that can be equalized. At this time, an equalization requisition time (the time required for the equalization) is obtained by the following formula. On the other hand, a residual time (specifically, the time until the effective SOC range of the assembled battery is zero) is not calculated due to be able to equalize.

Equalization requisition time $[h]=(SOCA-SOCB)/((i_{SD\_A}-i_{SD\_B})+i_{Balance})$ If the self-discharge current difference and the equalization current is balanced (if $i_{SD\_B} - i_{SD\_A} = i_{Balance}$), it can be determined to be in state that a spreading speed of the residual capacity difference and a regulating ability of the equalization circuit is balanced. Thus, the equalization requisition time and the residual time is not calculated because the denominator of the calculation formula is to zero by $i_{SD\_B} - i_{SD\_A} = i_{Balance}$.

In a case that the self-discharge current difference is larger than the equalization current (if $i_{SD\_B} - i_{SD\_A} > i_{Balance}$), it cannot be equalized even if it is tried to equalize the residual capacity. It can be determined that the residual capacity difference among the unit cells is in the state of expanding. According to the residual capacity difference expanding with the passage of time, if the effective SOC range (which is obtained from the difference between the SOC LIMIT RANGE and the residual capacity difference) of the assembled battery becomes narrow and the effective SOC range is zero, it cannot function as the assembled battery because there is no range of being able to charge and discharge. Thus, the residual time is obtained by the following formula. Meanwhile, the equalization requisition time is not obtained because it is in the state of being not able to equalize. It should be noted that the $\Delta SOC_{Limit}$ represents the SOC LIMIT RANGE [Ah] in the formula of the residual time.

residual time$[h]=(\Delta SOC_{Limit}-(SOCA-SOCB))/|(i_{SD\_A}-i_{SD\_B})+i_{Balance}|$ In FIG. 1(C), as the waveform shows in a case that the self-discharge current difference is larger than the equalization current i (if $i_{SD\_B} - i_{SD\_A} > i_{Balance}$), it can be seen that it is possible to extend the residual time of the assembled battery by using the equalization circuit, even in the state of not being able to equalize the residual capacity (when it cannot obtain the equalization requisition time). In addition, in FIG. 1(C), as the waveform shows in a case that the self-discharge current difference and the equalization current are balanced i (if $i_{SD\_B} - i_{SD\_A} = i_{Balance}$), it can be seen that it is possible to maintain the current effective SOC range in a case that the self-discharge difference and the equalization current are balanced.

Figure 2:
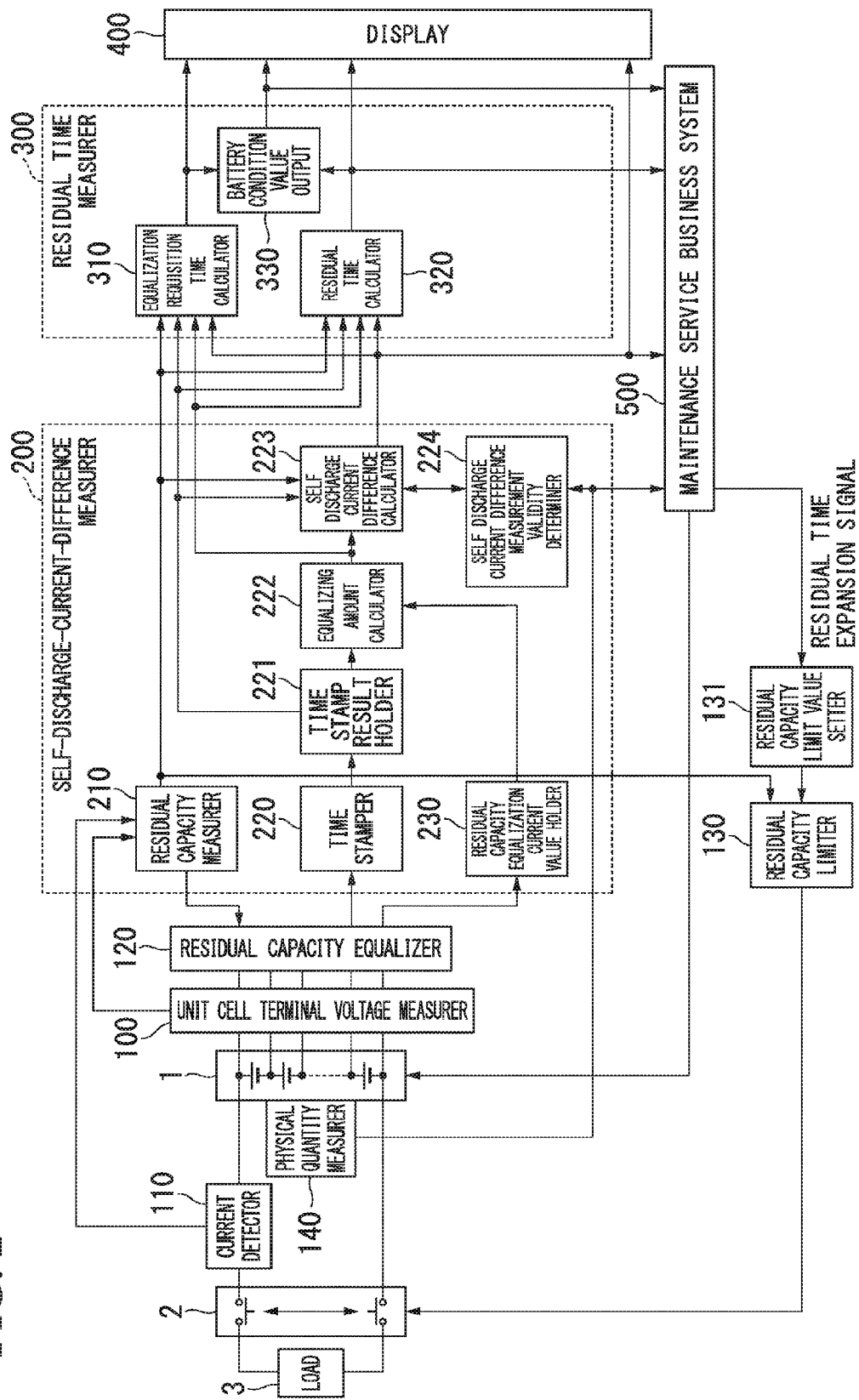
FIG. 2 is a diagram showing an example of a schematic configuration of a power storage service system according to the embodiment of the present invention.

The power storage service system in the present embodiment, is the power storage service system which controls the electric power system and which uses the assembled battery system including a plurality of the unit cells including: a self-discharge current difference measurer for measuring the self-discharge current difference between the unit cells; and a residual time measurer for obtaining the residual time of the assembled battery system using the measurement value of the self-discharge current difference measurer. FIG. 2 is a diagram showing an example of a schematic configuration of the power storage service system according to the present embodiment. As shown in FIG. 2, the power storage service system includes, a unit cell terminal voltage measurer 100, a current detector (acquirer) 110, a residual capacity equalizer 120, a residual capacity limiter 130, a residual capacity limit value setter 131, a physical quantity measurer 140, a self-discharge current difference measurer 200, a residual time measurer 300, a display 400, and a maintenance service business system 500.

In FIG. 2, an assembled battery 1 is constructed by a combination of a plurality of unit cells. The unit cell is a secondary cell such as a lithium ion battery. A switcher 2 connects or disconnects the assembled battery 1 and the load 3 based on the signal supplied from the residual capacity limiter 130. The load 3 is the load to the assembled battery 1.

The unit cell terminal voltage measurer 100 is connected to the positive electrode terminal and the negative electrode terminal of each unit cell, and detects the voltage of the unit cell. The current detector 110 detects the current of the assembled battery 1. The residual capacity equalizer 120 determines the targeted residual capacity based on the residual capacity of the unit cell obtained from the residual capacity measurer 210, and adjusts the residual capacity of each of the unit cells to the target value, to equalize the residual capacity between the unit cells. The residual capacity limiter 130 holds the upper limit value of the residual capacity and the lower limit value of the residual capacity as the limit value of the residual capacity. If the residual capacity exceeds to the range of the limit value, the residual capacity limiter 130 provides the limit signal to the switcher 2 for prohibiting charging and discharging in order to stop using the assembled battery, by comparing the residual capacity obtained from the residual capacity measurer with the limit value. The residual capacity limit value setter 131 sets the limit value of the residual capacity limiter 130 based on the expansion signal of the residual time (the residual time expansion signal). The physical quantity measurer 140 measures the physical quantity for detecting abnormal state of the unit cell, for example, includes a means for detecting a temperature of the unit cell and a dilatation of the external form of the unit cell.

The self-discharge current difference measurer 200 includes a residual capacity measurer 210, a time stamper 220, a time stamp result holder 221, an equalization quantity calculator 222 (a first obtainer), a self-discharge current difference calculator 223 (a second obtainer), a self-discharge current difference measurement validity determiner 224, and a residual capacity equalization current value holder 230 (a current value holder 230). The self-discharge current difference measurer 200 measures the self-discharge current difference of the unit cell by using the residual capacity measurer 210, a time stamper 220, a time stamp result holder 221, a residual capacity equalization current value holder 230, an equalization quantity calculator 222, and a self-discharge current difference calculator 223, leading to detect the abnormality of the unit cell by using the self-discharge current difference, the physical quantity measurer 140, and the self-discharge current difference measurement validity determiner 224.

The residual capacity measurer 210 detects the residual capacity of the unit cell. The residual capacity measurer 210 obtains the differential characteristics (a first differential characteristics curve) from the voltage obtained from the unit cell terminal voltage measurer 100 and the current obtained from the current detector 110, and then applies actually measured differential characteristics (the first differential characteristics curve) to the differential characteristics (a second differential characteristics curve) as the criterion by using an optimization function, and thereby detecting the residual capacity of the unit cell. The time stamper 220 generates and records measurement time of the residual capacity obtained from the residual capacity measurer 210, and operation starting time and operation ending time of the equalization of the residual capacity equalizer 120 as a time stamp. The time stamp result holder 221 holds a time stamp generated from the time stamper 220. The equalization quantity calculator 222 defines the operation starting time of the equalization obtained from the time stamp result holder 221 as integration starting time of the adjustment quantity, and defines the operation ending time of the equalization as integration ending time of the adjustment quantity. Then, the equalization quantity calculator 222 obtains result of integrated equalization current value obtained from the equalization current value holder 230 as the equalization adjustment quantity obtained from the residual capacity equalizer 120. The self-discharge current difference calculator 223 obtains the self-discharge current difference of each of the unit cells to a criterion value, by using the residual capacity obtained from the residual capacity measurer 210, the measurement time of the residual capacity obtained from the time stamp result holder 221, and the equalization adjustment quantity obtained from the equalization quantity calculator 222. It is used the value obtained by using the calculation method of multiplying coefficient to the residual capacity value of any unit cells, a maximum value of the residual capacity, a minimum value of the residual capacity, and an average of the residual capacity or the residual capacity as the criterion value. The self-discharge current difference measurement validity determiner 224 detects the abnormal state of the unit cell of which the self-discharge current difference obtained from the self-discharge current difference calculator 223 is the largest, by using the value obtained from the physical quantity measurer 140. For example, the physical quantity measurer 140 may use the temperature and the dilatation of the external form of the unit cell. The residual capacity equalization current value holder 230 holds the equalization current value.

The residual time measurer 300 includes an equalization requisition time calculator 310 (a third obtainer), a residual time calculator 320 (a fourth obtainer), and a battery state value output unit 330. The residual time measurer 300 obtains the equalization requisition time by using the equalization requisition time calculator 310 if the equalization is possible, or obtains the residual time using the residual time calculator 320 if the equalization is impossible, and obtains the assembled battery state value by using the battery state value output unit 330. The equalization requisition time calculator 310 obtains the equalization requisition time by using the self-discharge current difference, the equalization current, and the residual capacity. The residual time calculator 320 obtains the residual time of the assembled battery by using the effective SOC range, the self-discharge current difference, the equalization current, and the residual capacity. The battery state value output unit 330 detects the assembled battery state by using the equalization requisition time obtained from the equalization requisition time 310 and the residual time obtained from the residual time calculator 320.

The display 400 displays the measurement value and the state value of the unit cell and the assembled battery 1. The maintenance service business system 500 makes a maintenance plan of the assembled battery system according to the self-discharge current difference, the results of self-discharge current difference validity determination, the residual time, and result of the battery state output. The maintenance service business system 500 extends the residual time until a maintenance correspondence by outputting the residual time expansion signal at the time of an abnormality determination, to maintain the assembled battery system.

Figure 3:
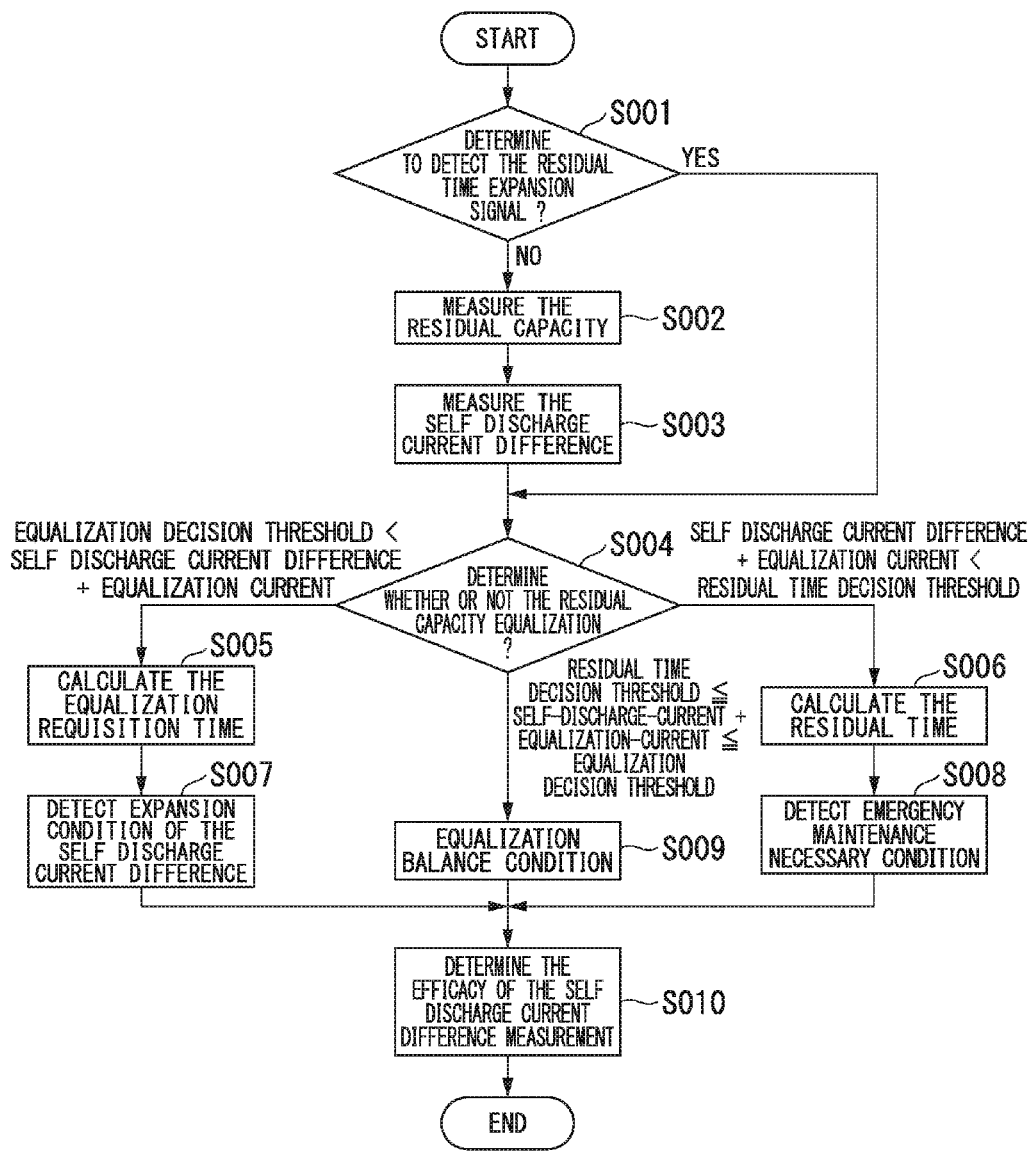
FIG. 3 is a flow diagram showing a calculation process of residual time and a detection process of a state of the battery in a power storage service system according to the embodiment of the present invention.

Subsequently, a calculation processing of the residual time and a detection processing of the battery state performed by the power storage service system will be described. FIG. 3 is a flow diagram showing a calculation process of residual time and a detection process of a state of a battery in a power storage service system according to an embodiment of the present invention. The power storage service system determines whether or not to detect the residual time expansion signal (step S001). If the residual time expansion signal is detected (Yes in step S001), the setting of the upper limit value of the residual capacity limiter 130, and the setting of the lower limit value, and/or the upper limit value, or both of them are changed. Therefore, the SOC LIMIT RANGE is renewed, and the process after step S004 is performed, and the residual time and the battery state are updated. If the residual time expansion signal is not detected (No in step S001), the following steps S002 is performed.

Then, the residual capacity is measured (step S002). The residual capacity of the unit cell is measured. The assembled battery 1 is charged and discharged, and the differential characteristic is obtained from the voltage value and/or the current value which is measured in time series. The residual capacity is obtained by fitting the differential characteristics to the differential characteristics as the criterion by using the optimization function, leading to detect the present quantity. The residual capacity is held as a result of the residual capacity measurement with the identifier of the unit cell and the time stamp indicating the measurement time of the residual capacity.

Then, the self-discharge current difference calculator 223 measures the self-discharge current difference (step S003). The self-discharge current difference calculator 223 measures the self-discharge current difference of the unit cell. The self-discharge current difference calculator 223 obtains the current residual capacity measurement result and the last (previous) residual capacity measurement result. The self-discharge current difference calculator 223 obtains the calculation period from the measurement time of the time stamp of the residual capacity measurement result, to obtain the equalization adjustment quantity of each of the unit cells in the calculation period. The self-discharge current difference is obtained by dividing the value by subtracting the residual capacity as the criterion and the equalization adjustment quantity as the criterion from the residual capacity of each of the unit cells and the equalization adjustment quantity by the calculation period. The self-discharge current difference is held as the result of the self-discharge current difference measurement along with the identifier of the unit cell and the time stamp that indicates the measurement time of the self-discharge current difference. The residual capacity as the criterion uses a value which is obtained by using a calculation method that multiplies the residual capacity of any of the unit cells, the maximum value of the residual capacity, the minimum value of the residual capacity, and the average of the residual capacity or the residual capacity by the coefficient. The equalization adjustment quantity as the criterion uses a value which is obtained by using a calculation method that multiplies the equalization adjustment quantity of any of the unit cell, the maximum value of the equalization adjustment quantity, the minimum value of the equalization adjustment quantity, and the average of the equalization adjustment quantity or the equalization adjustment quantity by the coefficient.

Then, propriety of the residual capacity equalization is determined (step S004). The power storage service system determines whether it is possible or impossible to equalize the residual capacity of the assembled battery 1. The self-discharge current difference of the unit cell and the equalization current of the residual capacity are obtained and the sum of the self-discharge current difference and the equalization current is obtained. The result of the above-noted calculation and equalization decision threshold and residual time decision threshold is compared, and the possible or impossible of the residual capacity equalization is determined. Relationship of the equalization decision threshold and the residual time decision threshold shall be target to "residual time decision threshold ≤equalization decision threshold". If "equalization decision threshold<self-discharge current difference+equalization current" is satisfied, the power storage service system can adjust the residual capacity difference, and determines that the equalization is possible because the regulating ability by the capacity equalization is larger than the self-discharge. If it is determined that it is possible to equalize, the process proceeds to step S005. If "self-discharge current difference+equalization current<residual time decision threshold" is satisfied, the power storage service system determines that the equalization is impossible because the self-discharge exceeds to the regulating ability due to the capacity equalization. If it is determined that it is impossible to equalize by the power storage service system, the process proceeds to step S006. If "residual time decision threshold≤self-discharge current difference+equalization current≤equalization decision threshold" is established, the power storage service system determines that the equalization of the residual capacity is impossible because self-discharge current and the equalization of the regulating ability are balanced, and it is determined that it is possible to maintain the effective SOC range. Thus, if it is determined that the self-discharge current and the regulation of the equalization are balanced, the process proceeds to step S009. For example, it is possible to determine that the equalization is possible if the equalization decision threshold and the residual time decision threshold is set to 0 and if the "self-discharge current difference+equalization current" is positive value. It is possible to determine the equalization is impossible if the "self-discharge current difference+equalization current" is negative value. It is possible to determine the self-discharge current and the regulating ability of the equalization is balanced if the "self-discharge current difference+equalization current" is zero. Actually, the sensitivity of the determination is adjusted by the desired value is set to the equalization decision threshold and the residual time decision threshold. In the present embodiment, the discharge is defined as positive value, and the charge is defined as negative value in the equalization current. When it is implemented by changing positive signs and negative signs, the equalization current value is converted so as to conform to signs of the present invention, and it is applied to the expressions and comparison determination according to the present embodiment.

The power storage service system obtains the equalization requisition time (step S005). In step S004, if "equalization decision threshold<self-discharge current difference+equalization current" holds, and if it is determined that it is possible to equalize, the power storage service system obtains the equalization requisition time required to equalize the assembled battery by using the self-discharge current difference, the equalization current, and the residual capacity difference.

The residual time is obtained (step S006). In step S004, if "self-discharge current difference+equalization current<residual time decision threshold" holds, and if it is determined that the equalization is impossible, the residual time of the assembled battery is obtained by using the self-discharge current difference, the equalization current, the effective SOC range, and the residual capacity.

The expansion state of the self-discharge current difference is detected (step S007). In step S005, if the equalization requisition time is obtained, it is the state that the residual capacity can be equalized. Thus, the power storage service system compares the self-discharge current difference with the self-discharge current difference expansion threshold, and if the self-discharge current difference is larger than the self-discharge current difference expansion threshold, it is determined that the self-discharge current difference is in the expansion state. On the other hand, if the self-discharge current difference is equal to or less than the self-discharge current difference expansion threshold, the power storage service system determines that the self-discharge current difference is in the normal state. The method of the determination of comparing the self-discharge current difference with the self-discharge current difference expansion threshold includes: the method directly comparing the self-discharge current difference with the self-discharge current difference expansion threshold, method comparing "self-discharge current difference+equalization current" with the self-discharge current difference expansion threshold, method comparing "self-discharge current difference/equalization current" with the self-discharge current difference expansion threshold, and method calculating quantity of change of the self-discharge current difference by comparing angle of approximate equation obtained by linearly approximating the results of the past self-discharge current difference with the self-discharge current difference expansion threshold.

Then, the emergency maintenance necessary state is detected (step S008). If the residual time is obtained in step S006, it is in the state which the self-discharge current difference exceeds the regulating ability based on the capacity equalization. Thus, it is determined that if "residual time<emergency maintenance judgment threshold" holds, it is determined that it is in the emergency maintenance necessary state. If the above relationship does not hold, it is determined that it is in effective SOC discharge state. The emergency maintenance judgment threshold is set the residual time until the pre specified maintenance service time. It is able to inform that it is in the state which the emergency maintenance service of non-stationary is required. For example, the next maintenance service time is set in advance, and the residual time from the current time to the next maintenance service time is obtained each time in each comparing the self-discharge current difference with the self-discharge current difference expansion threshold, the emergency maintenance necessary state is determined as the emergency maintenance judgment threshold.

The equalization balance state is detected (step S009). In step S004, the assembled battery state is determined that is in the equalization balance state if "residual time decision threshold≤self-discharge current+equalization current-≤equalization decision threshold" holds.

The efficacy of the self-discharge current difference measurement is determined (step S010). Regarding the unit cell of which the self-discharge current difference is maximum, the measurement value of the physical quantity of the unit cell is compared with the other unit cell. For example, a temperature of the power storage service system is compared with a dilatation of an external form of the unit cell. As a result of the comparison, if the temperature and the dilatation of external form of the unit cell exceed the threshold, the unit cell is determined that it is in the abnormal state.

Figure 4:
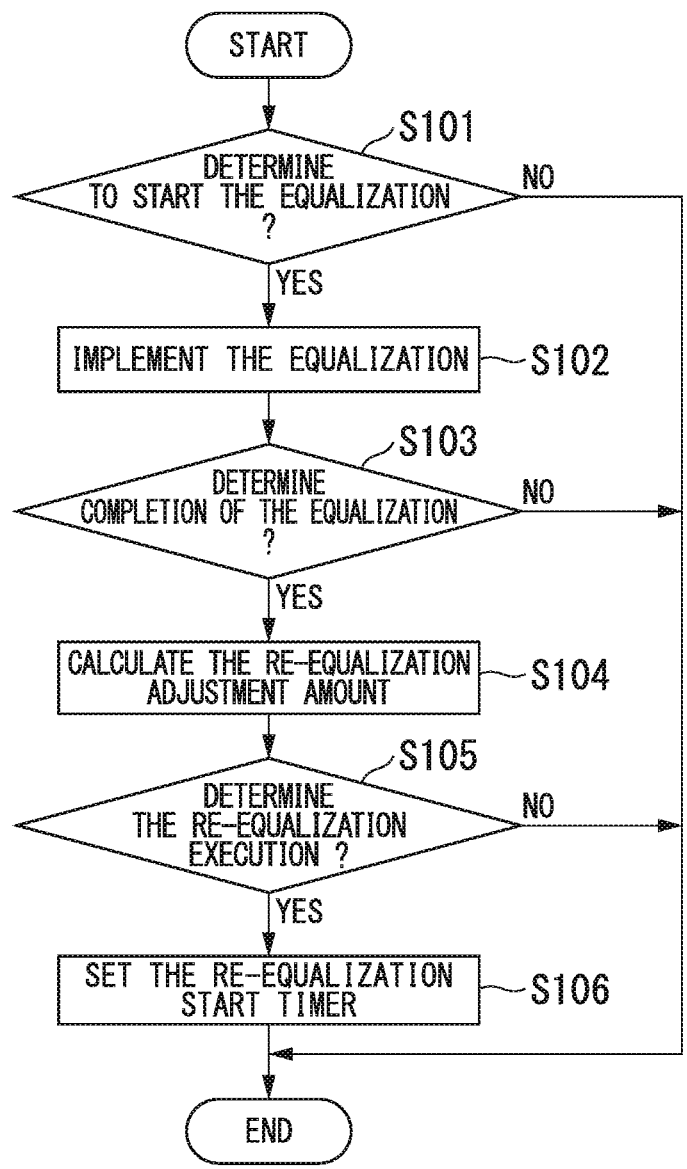
FIG. 4 is a flow diagram showing an equalizing process of the residual capacity in the power storage service system according to the embodiment of the present invention.

The residual capacity equalization processing performed by the power storage service system will be described. FIG. 4 is a flow diagram showing an equalizing process of the residual capacity in the power storage service system according to an embodiment of the present invention. The power storage service system determines whether or not to start the equalization (step S101). If the battery state is in the state of which the equalization of the residual capacity is possible, the power storage service system determines the timing which is able to perform the equalization. When the equalization requisition time of the residual capacity is obtained, it is capable of equalization. Because the target adjustment quantity of the equalization has been determined, the power storage service system determines that the equalization can be started (adjustment after measuring the residual capacity). When the signal of start timing is detected by a starting timer set by the determination of a re-equalization, it is determined that it is able to start on the basis of the target re-adjustment quantity (an adjustment by the self-discharge prediction). On the other hand, if the battery state is in the state which the equalization is impossible, and the residual time expansion signal is detected, it is determined that the equalization is able to be executed for the purpose of extension of the residual time (an expansion of the residual time). In this case, a value is obtained by subtracting the maximum self-discharge current difference from the self-discharge current difference of each of the unit cells, and the value is compared with the equalization current. If the value is larger than the equalization current, the target adjustment quantity is set so as to be continuously equalized by setting as unlimited. As described above, in the determination of the starting of the equalization, if it is determined that the equalization is able to be performed (Yes in step S101), the process proceeds to step S102.

The equalization is implemented (step S102). The residual capacity is modulated using the residual capacity equalizer 120 (an equalization circuit) for the unit cell which is set the target adjustment quantity. The completion of the equalization is determined (step S103). The cumulative value of the equalization current and the target adjustment quantity is compared, and the completion of the equalization or the re-equalization is determined (Yes in step S103). In a case that the equalization or the re-equalization has not been completed, the equalization or the re-equalization is continued (No in step S103).

A re-equalization adjustment quantity is obtained (step S104). The effective SOC range of the assembled battery narrows, because the residual capacity difference increases with the passage of time by the self-discharge current difference after the equalization. If sufficient effective SOC range cannot be secured, the operation of the assembled battery is interfered. In after the equalization or after the re-equalization, the effective SOC range narrows by the self-discharge current difference, the time which is equal to or less than the re-equalization threshold is obtained, and the time is stored as the re-equalization starting time. The predicted residual capacity of each of the unit cells in the re-equalization starting time from the self-discharge current difference of each of the unit cells is obtained, and the adjustment quantity as the target re-adjustment quantity in the case of equalizing with the predicted residual capacity is obtained and stored.

The re-equalization execution determination is performed (step S105). The re-equalization starting time and the scheduled time of the next residual capacity measurement are compared, if the re-equalization starting time is prior to the scheduled time of the next residual capacity measurement (step S105—Yes), the execution of the re-equalization is determined. The re-equalization starting timer is set (step S106). The date and time for notifying on the basis of the re-equalization starting time is set to a timer notifying the start timing of the re-equalization, and the timer starts.

Figure 5:
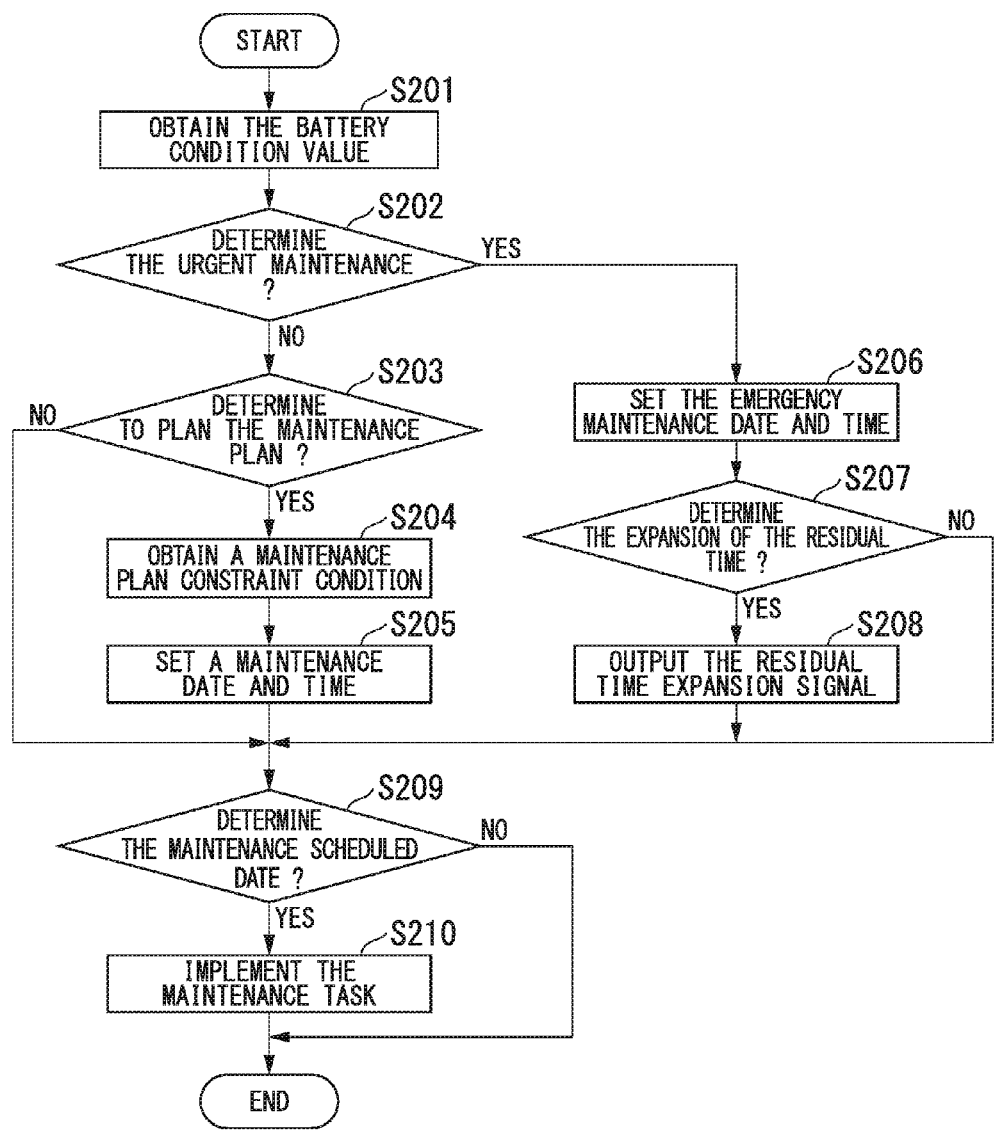
FIG. 5 is a flow diagram showing a maintenance service processing in the power storage service system according to the embodiment of the present invention.

The following describes the maintenance service processing performed by the power storage service system. FIG. 5 is a flow diagram showing a maintenance service processing in the power storage service system according to an embodiment of the present invention. The power storage service system obtains the battery state value (step S201). The power storage service system obtains the detection result of the battery state and the result of the self-discharge current difference validity determination. A determination of the emergency maintenance is performed (step S202). If the battery state is detected that is in the emergency maintenance necessary state or that is in the abnormal state in the self-discharge current difference validity determination, the emergency maintenance is necessary (Yes in step S202).

The planning of the maintenance plan is determined (step S203). The start timing of the planning of the maintenance plan is determined in accordance with the periodic maintenance interval which is targeted to the periodic maintenance (Yes in step S203). The maintenance plan constraint state is obtained (step S204). In determining of the maintenance schedule, the arrangement possible date of the replacement part (including battery), the maintenance scheduled date of another set of the assembled battery, an available date of the arrangement of the maintenance personnel, and an available date of the maintenance for the maintenance service provided customer, as a constraint state. The date and time of the maintenance is set (step S205). The feasible date and time based on maintenance plan constraint state is determined, and is resisted in the maintenance plan.

The emergency maintenance date and time is set (step S206). The arrangement possible date of the unit cell to be replaced is determined, and the maintenance task possible date and time is determined. The expansion of the residual time is determined (step S207). The residual time is compared with the emergency maintenance date and time. If the emergency maintenance is not finished before the residual time runs out, it is determined that the expansion of the residual time is necessary (Yes in step S207). The residual time expansion signal is outputted (step S208). If it is determined that the expansion of the residual time is necessary, the residual time expansion signal is outputted. According to output the signal, the upper limit value or the lower limit value or both of the upper limit value and the lower limit value of the SOC LIMIT RANGE which limits the residual capacity is spread, the residual time is notified so as to extend the residual capacity.

The maintenance scheduled date is determined (step S209). When the maintenance scheduled date which is registered in the maintenance plan is arrived, it is determined that the maintenance is possible (step S209—Yes). The maintenance task is implemented (step S210). The actual maintenance task is implemented. The unit cell to be exchanged is exchanged, in addition to confirm the contents which is defined in the periodic inspection.

Figure 6:
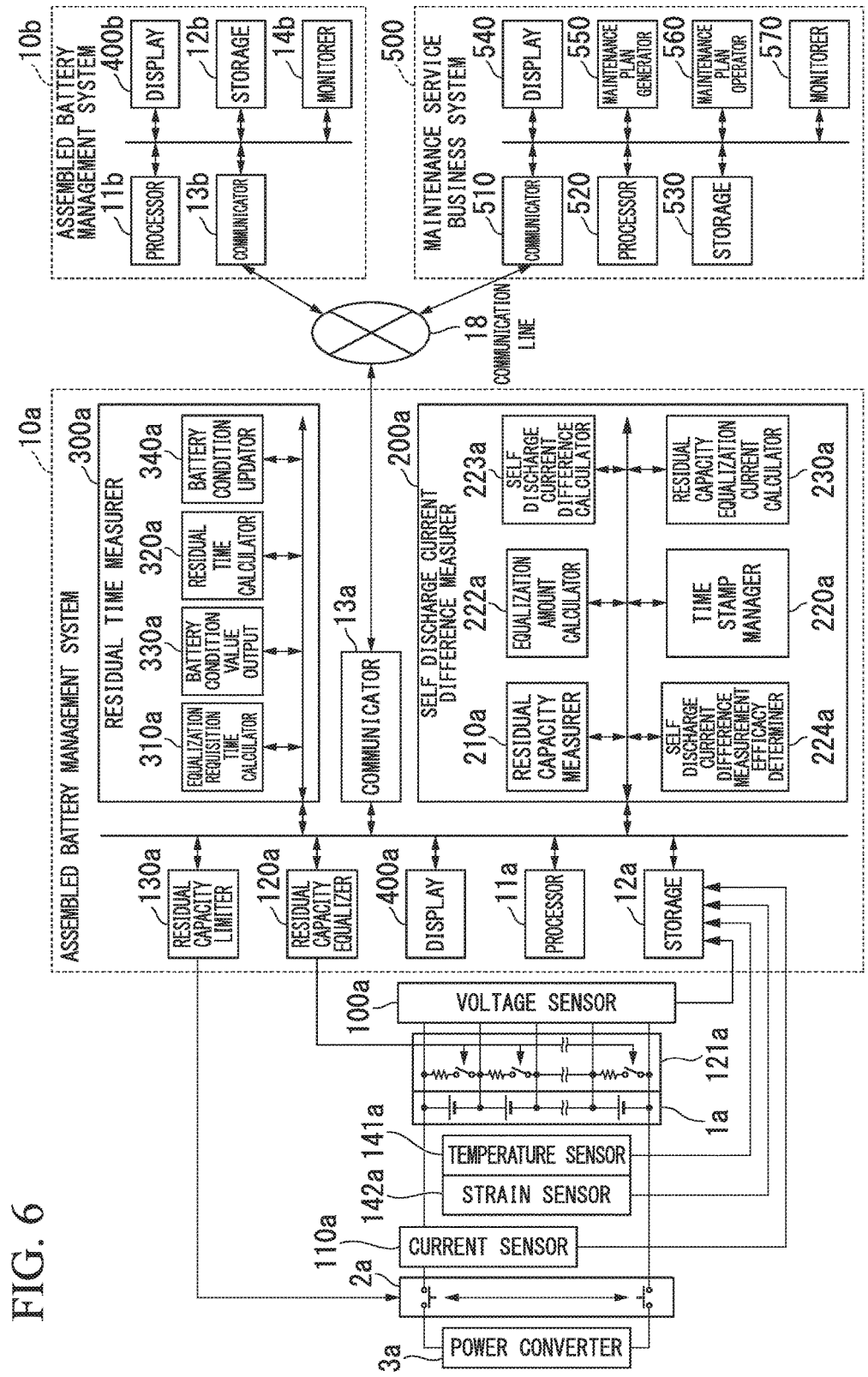
FIG. 6 is a diagram showing an example of a configuration of a power storage service system according to the embodiment of the present invention.

Next, the embodiment of the power storage service system described above will be described in more detail. FIG. 6 is a diagram showing an example of a configuration of a power storage service system shown in FIG. 2 according to an embodiment of the present invention. The power storage service system includes an assembled battery management system 10a, and 10b, a maintenance service business system 500, and a communication line 18. The assembled battery management system 10a includes a self-discharge current difference measurer 200a, a residual time measurer 300a, a residual capacity limiter 130a, a residual capacity equalizer 120a, and a display 400a, a processor 11a, a storage 12a, and a communicator 13a. It should be noted that the processor 11a is a hardware for executing (processing) instruction set (transferring of data, calculation, processing, control, and management, etc.) described in the software program in the assembled battery management system 10a. The processor 11a includes a CPU, a register for storing instructions and information, and a peripheral circuit or the like. The assembled battery management system 10b includes same configuration as the assembled battery management system 10a, and exchanges data with the maintenance service business system 500 via the communication line 18 along with the assembled battery management system 10a. In FIG. 6, only a processor 11b, a display 400b, a communicator 13b, a storage 12b, and a monitorer 14b included in the assembled battery management system 10b are shown, and another unit is omitted.

With reference to FIG. 6, relationship between the assembled battery and wire, sensors, self-discharge measurement, re equalization, output of the battery state, display and visualization method, and maintenance service will be described as follows.

(Relationship Between the Assembled Battery and the Wire)

The assembled battery 1a (corresponding to the assembled battery 1) for a stationary which is combined the secondary cell such as the lithium ion battery is utilized for many purposes as a power energy storage device by connecting to a power converter 3a (corresponding to the load 3) such as a power conditioner charging and discharging. The switch 2a (which corresponds to the switcher 2) is installed between the assembled battery 1a and the power converter 3a to control the connection, leading to control the connection for occasion of the abnormality such as an over charge and an over discharge and for a suspension of use state at the time of the maintenance task.

(Sensors)

A voltage sensor 100a (corresponding to the unit cell terminal voltage measurer 100) is connected to a terminal of a positive electrode and a negative electrode in each of the unit cells. A temperature sensor 141a and a strain sensor 142a for measuring changes of external dimension such as the dilatation of the external form of the battery such as a strain gauge are installed on the exterior of the assembled battery 1a. The measurement value detected from a set of sensor 140a (corresponding to the physical quantity measurer 140) at regular interval is successively stored in the storage 12a. A current sensor 110a (corresponding to the current detector 110) is installed between the assembled battery 1a and the power converter 3a, the measurement value detected at regular interval from the current sensor 110a is successively stored in the storage 12a. The monitorer 14b monitors the battery state value from a remote place via the communication line such as the Internet.

(Self-discharge Measurement)

The self-discharge current difference measurer 200a (corresponding to the self-discharge current difference measurer 200) includes a residual capacity measurer 210a, a time stamp manager 220a, an equalization quantity calculator 222a, a self-discharge current difference calculator 223a, a self-discharge current difference measurement efficacy determiner 224a, and a residual capacity equalization current calculator 230a. The residual capacity measurer 210a corresponds to the residual capacity measurer 210. The equalization quantity calculator 222a corresponds to the equalization quantity calculator 222. The self-discharge current difference calculator 223a corresponds to the self-discharge current difference calculator 223. The self-discharge current difference measurement efficacy determiner 224a corresponds to the self-discharge current difference measurement validity determiner 224. The time stamp manager 220a corresponds to the time stamper 220. The storage 12a corresponds to the time stamp result holder 221. The residual capacity equalization current calculator 230a (corresponding to the residual capacity equalization current value holder 230) stores the equalization current value in the storage 12a.

The residual capacity measurer 210a obtains the residual capacity representing the charge state of the unit cell as a value sequentially integrated the electric quantity detected by the current sensor. However, with the passage of time, an error occurs between the actual charge state and the residual capacity by a measurement error and the self-discharge of the battery. The residual capacity measurer 210a measures the charge state regularly in a manner different from that of the current integration, for example, every one week, or every one month. Although it has been described regarding the embodiment of the periodically measuring technology, if a state capable of the residual capacity measurement is satisfied, it may be implemented non-regularly. If an interval implementing regularly can be kept within error 5% in one month, for example, assuming a measurement error 2% in one month and a self-discharge 3% in one month, it is able to determine that the residual capacity measurement is performed for every one month. The residual capacity is detected by using means that is described in Japanese Patent Application No. 2014-177268, and Japanese Patent Application No. 2015-103851 as the residual capacity measurer 210a. When the residual capacity is measured, the time stamp manager 220a generates a combination of the residual capacity of each of the unit cells and the time stamp indicating the measurement time, and to store its contents to the storage 12a. Before starting operation of the assembled battery management system 10a, the residual capacity measurer 210a may store the residual capacity obtained by performing the residual capacity measurement in advance, or the residual capacity of the initial value at the time of the factory shipment, and the measurement time to the storage 12a, for the purpose of the residual capacity measurement.

When the residual capacity is measured, the residual capacity equalizer 120a obtains the difference between the minimum value and the residual capacity as the target adjustment quantity of each of the unit cells by defining the minimum value of the residual capacity as the criterion value. The equalization circuit 121a includes a switch for controlling the discharge and the discharge circuit such as a resistor connected to both ends of the electrodes of each of the unit cells, and receives a signal from the residual capacity equalizer 120a, to discharge the unit cell. The residual capacity equalizer 120a and the equalization circuit 121a correspond to the residual capacity equalizer 120. The residual capacity equalizer 120a outputs a signal, and to discharge so that the discharge quantity becomes equal to the target adjustment quantity. For example, in a case of using a resistor as a discharge circuit, the residual capacity equalization current calculator 230a obtains the equalization current obtained by dividing the voltage value measured by the voltage sensor 100a by the resistance value, and the residual capacity equalizer 120a compares successively the value multiplied the equalization current value with the target adjustment quantity, and to determine the suspension of the equalization circuit 121a. The residual capacity equalization current calculator 230a divides the predetermined voltage value by the resistance value to obtain the equalization current, and then obtains the equalization time by dividing the target adjustment quantity by the equalization current. Then, the residual capacity equalization current calculator 230a may switch off the equalization circuit 121a when a timer notices passing equalization time.

The equalization quantity calculator 222a receives signal from the residual capacity equalizer 120a, and successively integrates the equalization current which the residual capacity equalization current calculator 230a determined from the voltage value of each of the unit cells and the resistance value of the discharge circuit, thereby calculating the integrated current value during period from the start to the end of the equalization of the residual capacity as the equalization adjustment quantity. The time stamp manager 220a generates the time stamp indicating the start and the end of the equalization, and combines the equalization adjustment quantity which the equalization quantity calculator 222a obtained, and to store its contents to the storage 12a. The residual capacity equalization current calculator 230a may obtain the equalization current using a predetermined voltage value and an average of the past voltage. The equalization circuit 121a may be a circuit configuration capable of charging and discharging in every unit cell by combining a power converter such as a switching regulator and a transformer. In this case, the charging and discharging control is performed such as charging the power discharged from one unit cell to one or more of the unit cell, or charging the power discharged from one or more of unit cell to one unit cell, and thereby equalizing the residual capacity by discharging from the unit cell having many residual capacity and charging to the unit cell having small residual capacity. The target adjustment quantity of the residual capacity equalization is detected by a current detecting resistor provided in the equalization circuit 121a as the average of the residual capacity.

Figures 7, 8:
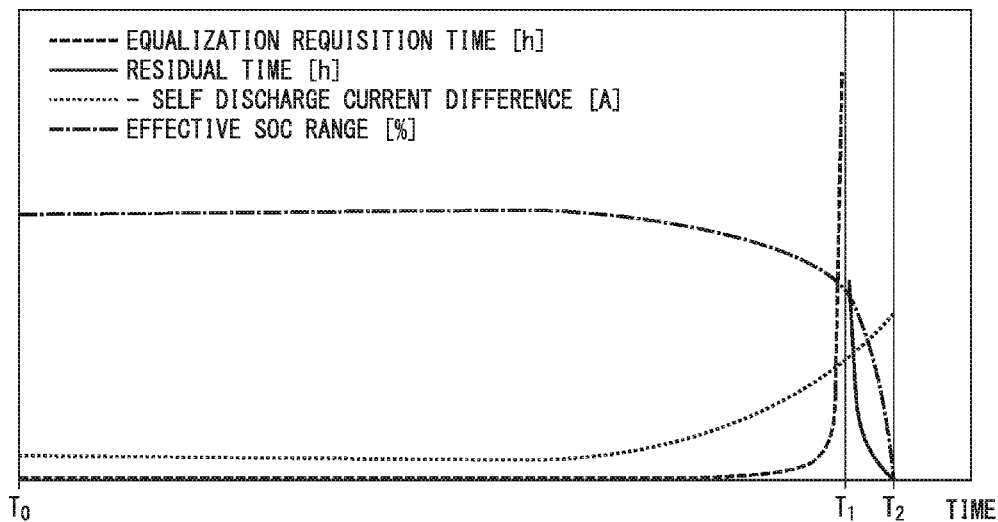
FIG. 7 is a diagram showing an example of a time stamp table according to the embodiment of the present invention.
FIG. 8 is a diagram showing a result of a simulation regarding calculation of an equalization requisition tome and a residual time according to the embodiment of the present invention.

The self-discharge current difference calculator 223a refers to the time stamp table of the residual capacity measurement result stored in the storage 12a, and to determine the calculation period. FIG. 7 is a diagram showing an example of a time stamp table. For example, since the time stamp table shown in FIG. 7 is aligned in ascending order of the measurement time, the self-discharge current difference calculator 223a determines the most recent calculation period of the self-discharge current difference from the (N−1) th and the Nth measurement time Tn−1 and the measurement time Tn. The self-discharge current difference calculator 223a acquires the equalization adjustment quantity calculated by the equalization quantity calculator 222a from the storage 12a regarding the equalization implemented in the calculation period of the self-discharge current difference.

The calculation of the self-discharge current difference of which the criterion is the unit cell having the maximum residual capacity will be described. The residual capacity which is the criterion is obtained by the following equation, and the j is the unit cell number of the unit cell as the criterion.

$$\mathrm{MAX}(SOC(j,T(N-1))), 1 \leq j \leq M$$

Thus, the self-discharge current difference of each of the unit cells is determined by the following formula. In the following formula, M represents the unit cell number, T (measurement history number) represents the residual capacity measurement time, SOC (unit cell number, measurement time) represents the residual capacity [Ah], $i_{SD}$ (unit cell number, measurement time) represents the self-discharge current difference [A], and $i_{CB\_Quantity}$ (unit cell number, time 1, time 2) represents the equalization adjustment quantity [Ah] from the time 1 to time 2.

$$1 \leq k \leq M$$

$$iSD(k,T(N)) = \{SOC(k,T(N)) - SOC(j,T(N)) - SOC(k,T(N-1)) + SOC(j,T(N-1)) + iCB\_\mathrm{Quantity}(k,T(N-1),T(N)) - iCB\_\mathrm{Quantity}(j,T(N-1),T(N))\}/(T(N)-T(N-1))$$

When the self-discharge current difference is measured by the self-discharge current difference calculator 223a, the time stamp manager 220a generates a combination of the identifier of each unit cell and the self-discharge current difference and the time stamp indicating the measurement time, to store its contents into the storage 12a.

In a case that the lithium ion secondary cell is used as the unit cell, an abnormal heating is caused because the internal short circuit occurs in the lithium ion secondary cell by precipitating the lithium from the lithium ion secondary cell, and the unit cell often failures. Even though it does not lead to failure, the self-discharge quantity increases because of repeating occurring of a small internal short circuit. As a result, the external form of the battery is changed due to the fluctuation of the residual capacity because of decreasing the charging and discharging efficiency, rising temperature of the battery exterior, rising internal pressure of the battery because of gasification of electrolyte, and expansion of an electrode material. It can increase reliance of the determination by adding the physical characteristics such as temperature or expansion degree different from the electrical characteristics to the judgment item for determining the abnormality in addition to the self-discharge current difference measured as the electrical characteristics of charging and discharging. When the self-discharge current difference is measured, the self-discharge current difference measurement efficacy determiner 224a identifies the one or more unit cell of the largest self-discharge current difference among the 1 to N-th self-discharge current difference measurement result from the time stamp table of the self-discharge current difference measurement result, and to be the target of efficacy determination. The self-discharge current difference measurement efficacy determiner 224a obtains the average value of the temperature and the expansion degree of the unit cell which is not the target of the efficacy determination, and sets them as the efficacy determination criterion value. It may use the maximum value as the efficacy determination criterion value. The self-discharge current difference measurement efficacy determiner 224a obtains the temperature and the expansion degree of the unit cell from the temperature sensor 141a and the strain sensor 142a which was the target of the efficacy determination, and obtains the difference between the temperature, the expansion degree and the efficacy determination criterion value. If the difference thereof exceeds threshold value, the self-discharge current difference measurement efficacy determiner 224a detects that the unit cell is in the abnormal state. The self-discharge current difference measurement efficacy determiner 224a may detect the abnormal state by comparing the temperature and the expansion degree of the unit cell which was the target of the efficacy determination with respective thresholds, without comparing the temperature and the expansion degree with the efficacy determination criterion value. The self-discharge current difference measurement efficacy determiner 224a stores information for identifying the unit cell that has been detected as the abnormal state into the storage 12a, to output detection signal of the abnormal state.

(Re-Equalization)

The residual capacity equalizer 120a obtains a value of the largest self-discharge current difference among the 1 to N-th self-discharge current difference measurement result from the time stamp table of the self-discharge current difference measurement result when the self-discharge current difference is measured. The current effective SOC range is calculated by the following equation. In the following equation, ΔSOC (measurement time) represents the residual capacity difference [Ah], $\Delta SOC_{Limit}$ represents the SOC LIMIT RANGE [Ah], and $\Delta SOC_{Range}$ (measurement time) represents the effective SOC range [Ah].

$$\Delta SOC(T(N))=MAX(SOC(j,T(N)))-MIN(SOC(j,T(N))), 1\leq j \leq M$$

$$\Delta SOC_{Range}(T(N))=\Delta SOC_{Limit}-\Delta SOC(T(N))$$

Thus, the re-equalization starting time obtains time which the difference between the effective SOC range and the re-equalization threshold is zero by the self-discharge current difference by the following equation. In the following equation, $\Delta SOC_{Rebalance}$ represents the re-equalization threshold [Ah], $T_{Now}$ represents the current time.

$$T_{Rebalance}(T(N))=T_{Now}+(\Delta SOC_{Range}(T(N))-\Delta SOC_{Rebalance})/MAX(|i_{SD}(j,T(N))|), 1\leq j\leq M$$

The residual capacity equalizer 120a starts the equalization when the re-equalization starting time passed by using a timer.

(Residual Time Measurement)

The residual time measurer 300a (corresponding to the residual time measurer 300) includes an equalization requisition time calculator 310a, a residual time calculator 320a, and a battery state value output unit 330a, a battery state updator 340a. The equalization requisition time calculator 310a corresponds to the equalization requisition time calculator 310. The residual time calculator 320a corresponds to the residual time calculator 320. The battery state value output unit 330a corresponds to the battery state value output unit 330. When the self-discharge current difference is measured, the residual time measurer 300a obtains the self-discharge current difference which is held in the storage 12a and the equalization current from a residual capacity equalization current calculator, and calculates the difference between the equalization current and the self-discharge current difference to calculate an equalization necessary time and the residual time by the following equation. In the following equation, $i_{Balance}$ (unit cell number, measurement time) represents the equalization current [A], $\Delta i_{Balance}$ (measurement time) represents difference between the equalization current and the self-discharge current difference [A].

$$\Delta i_{Balance}(T(N))=i_{Balance}(j,T(N))+MIN(i_{SD}(k,T(N))), 1\leq k\leq M$$

The j is identified in $MAX(i_{SD}(j,T(N)))$, $1\leq j\leq M$

The residual time measurer 300a determines that it is possible to calculate the equalization time if "equalization decision threshold<equalization current+self-discharge current difference" is satisfied, then the equalization requisition time calculator 310a calculates the equalization requisition time by the following equation. In the following equation, $TimeSpan_{Balance}$ (T (N)) represents the equalization requisition time [h].

$$TimeSpan_{Balance}(T(N))=\Delta SOC(T(N))/\Delta i_{Balance}(T(N))$$

In addition, the residual time measurer 300a determines that it is possible to calculate the residual time if "equalization current+self-discharge current difference<residual time decision threshold", then the residual time calculator 320a calculates the residual time by the following equation. In the following equation, $TimeSpan_{Remain}$ (T (N)) represents the residual time [h].

$$TimeSpan_{Remain}(T(N))=(\Delta SOC_{Limit}-\Delta SOC(T(N)))/|\Delta i_{Balance}(T(N))|$$

FIG. 8 is a diagram showing a result of a simulation regarding the calculation of the equalization requisition time and the residual time. As shown in FIG. 8, when the state is set that a specific unit cell among the set of the unit cell included in the assembled battery 1a increases the self-discharge according to the lapse of time, the effective SOC range of assembled battery is narrowed because the unit cell spreads the residual capacity difference. During the time T0 to T1 satisfied the relationship "−self-discharge current difference<equalization current", the equalization requisition time is calculated. After the time T1 satisfied the relationship "self-discharge current difference>equalization current", the residual time is calculated. The Calculated is terminated at T2 when the effective SOC range is zero.

(Output of the Battery State)

The battery state value output unit 330a determines that the battery state of the assembled battery 1a is the normal state, the expansion state of the self-discharge current difference, the equalization balance state, the effective SOC discharge state, or the emergency maintenance necessary state. Since the SOC limit range has been changed because of the one or both of the residual capacity upper limit value and the residual capacity lower limit value of the residual capacity limiter 130a is changed based on the residual time expanding signal for expanding the residual time until the effective SOC range of the assembled battery system is zero, the battery state updator 340a re-calculates the residual time and updates the battery state value. Relationship of the battery state for the self-discharge current difference can also be specifically understanding in FIG. 8. The residual time measurer 300a detects the period from T0 to T1 with distinguishing the normal state and the expansion state of self-discharge current difference by comparing the self-discharge current difference and the self-discharge current difference expansion threshold. The residual time measurer 300a can detect the period from T1 to T2 with distinguishing the effective SOC discharge state and the emergency maintenance necessary state by comparing the residual time and the emergency maintenance judgment threshold. And the maintenance service in accordance with the battery state is available.

(Display and Visualization Method)

Figure 9:
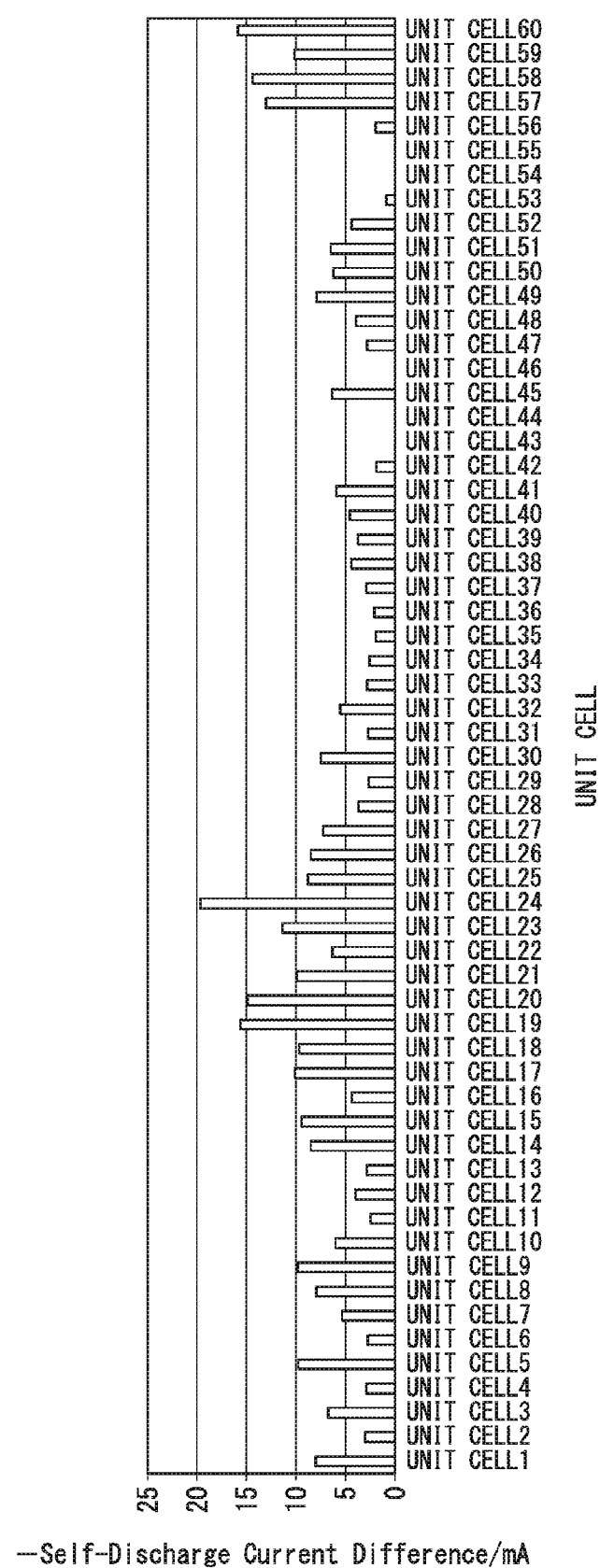
FIG. 9 is a diagram showing an example of a self-discharge current difference of a unit cell in a bar graph format according to the embodiment of the present invention.
Figure 10:
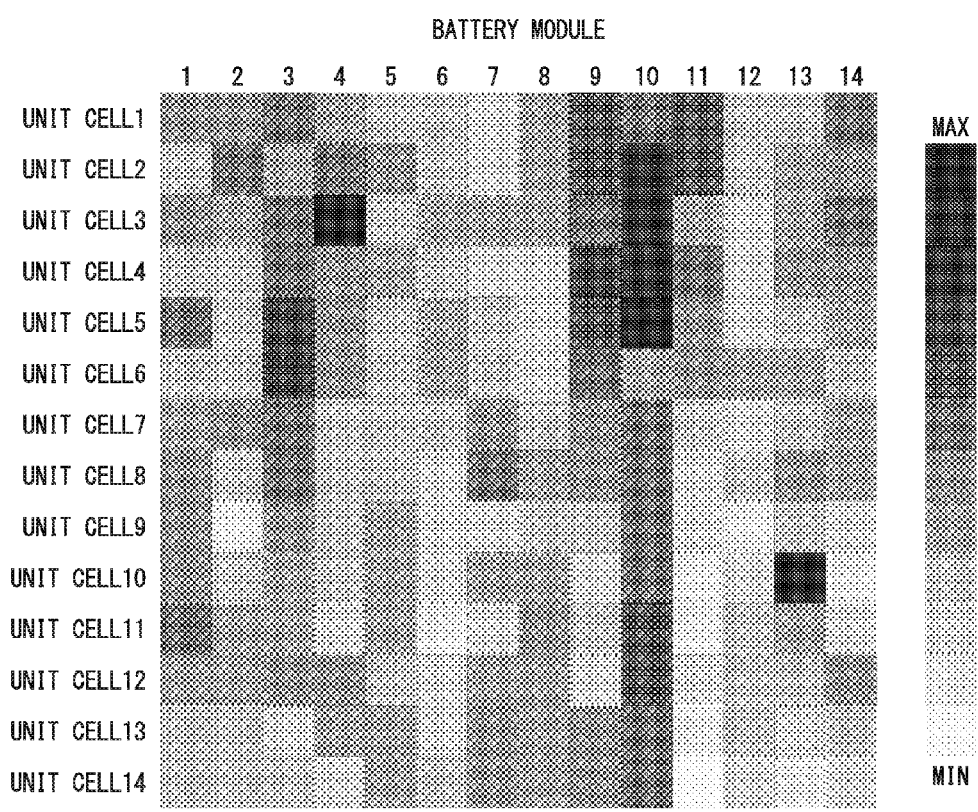
FIG. 10 is a diagram showing an example of a self-discharge current difference between unit cells in a heat map format according to the embodiment of the present invention.

The display 400a displays the measurement value of the sensors such as the voltage sensor 100a, the current sensor 110a, the temperature sensor 141a, and the strain sensor 142a on a display. The display 400a displays the measurement value which is obtained from the residual capacity, the self-discharge current difference, and the equalization adjustment quantity on the display. The display 400a displays the state such as the equalization requisition time, the residual time, and the battery state value. The measurement value may be displayed adding statistics such as maximum, minimum, average, and standard deviation. The above noted value may be displayed with a table format, and may be placed on the diagram schematic such as the assembled battery system, or may be displayed on a graph such as trend graphs, heat maps, bar charts, line charts, or area charts so that it can be compared the display elements at a glance. FIG. 9 is a diagram showing an example of displaying the self-discharge current difference of the unit cell in the bar chart format. FIG. 9 represents the number of the unit cell (cell number) on the horizontal axis, and represents the self-discharge current difference (−Self-Discharge Current Difference/mA) of the unit cell on the vertical axis. FIG. 9 shows an example of a comparative display so as to allow understanding of the sizes and magnitude relation of the self-discharge easily by displaying the self-discharge current difference of the unit cell in the bar chart format. FIG. 10 is a diagram showing an example of displaying the self-discharge current difference of the unit cell in a heat map format. FIG. 10 shows a display example which is able to understand visually the unit cell which the self-discharge current difference is large by displaying the self-discharge current difference of the unit cell in the heat map format. The heat map enables identifying the unit cell by displaying with dividing into every module gathering a plurality of the unit cell, and dividing into every assembled battery and every module in the case of comparing a plurality of assembled battery. A monitor such as one or more displays is used as the display. It may also be used a portable terminal such as a tablet computer or smart phone. It may obtain display contents using a communication line such as the Internet to monitor remotely. The display contents may be stored in the storage device, and may be displayed on the display.

(Maintenance Service)

The maintenance service business system 500 is a system for managing the maintenance business of the assembled battery device, and the assembled battery management system 10a and 10b. As shown in FIG. 6, the maintenance service business system 500 includes a communicator 510, a processor 520, a storage 530, a display 540, a maintenance plan generator 550, a maintenance plan operator 560, and a monitorer 570. The maintenance service business system 500 is connected to the assembled battery management system 10a and 10b by the communication line 18 such as the Internet, to access information in the storage 12a and 12b of the assembled battery management system 10a and 10b using the communicator 510. In addition, the maintenance service business system 500 displays the same contents as the display 400a and 400b of the assembled battery management system 10a and 10b to the display 540 by storing the acquired information into the storage 530.

FIG. 11 is a diagram showing an example of the maintenance plan. The maintenance plan generator 550 plans a schedule, and registers information regarding the maintenance scheduled date, days (period), type (operation contents), installation place, field operator, and parts on the maintenance plan table shown in FIG. 11. In preparing the plan, the field worker plans by collating schedule capable maintaining the maintenance service provided customer, assignment state of the field worker, availability of parts and date available to arrange as states. The maintenance scheduled date may be determined using either method whether determining the date capable of assigning by the combination optimum or the registering into the maintenance plan table manually. For example, when it comes to predetermined days prior to the periodic maintenance once a year, the field worker starts the planning of the schedule. Then the date capable of assigning is determined, the field worker registers the date in the maintenance plan table.

The maintenance plan generator 550 plans the emergency maintenance for replacing the abnormal battery as soon as possible if the battery state value is in the emergency maintenance necessary state. The maintenance service business system 500 obtains the latest battery state value by regularly accessing to the assembled battery management system 10a and 10b. The assembled battery management system 10a and 10b may notify to the maintenance service business system 500 at the timing when the battery state value has been updated.

Figures 12, 13:
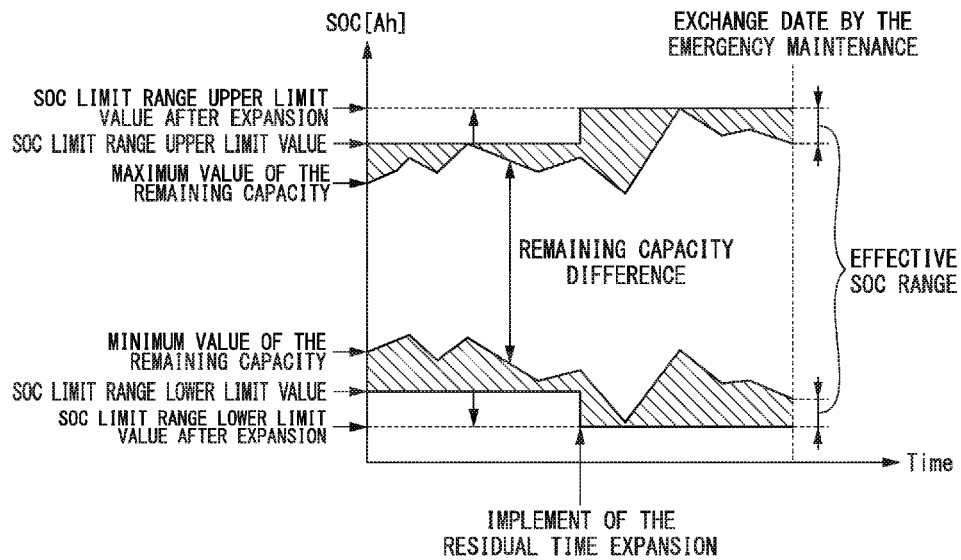
FIG. 12 is a diagram showing an example of expansion of SOC limit range according to the embodiment of the present invention.
FIG. 13 is a diagram showing an example of a SOC limit range selection table according to the embodiment of the present invention.

FIG. 12 is a diagram showing an example of expansion of the SOC LIMIT RANGE. The horizontal axis represents time and the vertical axis represents the SOC [Ah] in FIG. 12. The maintenance plan generator 550 compares the difference between the predetermined emergency maintenance date and the current time with the residual time of the assembled battery. If the residual time is less than the difference, the maintenance plan generator 550 changes the setting so that the SOC LIMIT RANGE of upper limit value or lower limit value or both of them of the SOC which the residual capacity limiter 130a of the assembled battery management system 10a spreads, and thereby extending the residual time as shown in FIG. 12. In a case that it is possible to postpone the emergency maintenance date by extending the residual time until the next periodic maintenance date, it may generate the maintenance plan so as to reduce the maintenance number of times by incorporating the task of the emergency maintenance into the periodic maintenance. The maintenance plan operator 560 notifies the field workers that are assigned as responsible for the arrival of the maintenance scheduled date with reference to the maintenance plan table. The monitorer 570 monitors the battery state value from the remote place via the communication line such as the Internet.

As described above, according to the present invention, it is possible to provide the power storage service system which is able to quantitatively grasp the time leading to the occurrence of the abnormality, and it allows to determine capability of avoiding the stopping of the function of the assembled battery system, and it gives a time margin for planning a response schedule and preparing to response to the assembled battery system maintenance operator and the maintenance service supplier, and it is able to reduce a cost of the maintenance correspondence by reducing and optimizing the number of times of the response.

As described above, it has been described in detail the embodiments of the present invention with reference to the accompanying drawings. The specific configuration is not limited to the embodiments. The design which is not departing from the major point of the invention is also included in the embodiments described above.

For example, the residual capacity limit value setter 131 shown in FIG. 2, defines in advance a plurality of candidates of the SOC LIMIT RANGE based on the residual time expansion signal, and it may be set the upper limit value and the lower limit value of the residual capacity limiter 130 by selecting from among those candidates. FIG. 13 is a diagram showing an example of the SOC LIMIT RANGE selection table. A plurality of candidates of the SOC LIMIT RANGE is defined in advance as the SOC LIMIT RANGE selection table shown in FIG. 13, and it may be set to the residual capacity limiter 130 by outputting a number with the residual time expansion signal, and by selecting the SOC LIMIT RANGE corresponding to the number from the SOC LIMIT RANGE selection table. It may be defined the upper limit value and the lower limit value of the SOC LIMIT RANGE selection table as the ratio, and the value obtained by multiplying the ratio to the maximum capacity or the nominal capacity may be used as a setting value to the residual capacity limiter 130.

It is possible to expand, shrink, or move the SOC LIMIT RANGE, and to combine them according to the upper limit value, the lower limit value of the SOC LIMIT RANGE selection table, and the selection method of the SOC LIMIT RANGE.

Figure 14A:
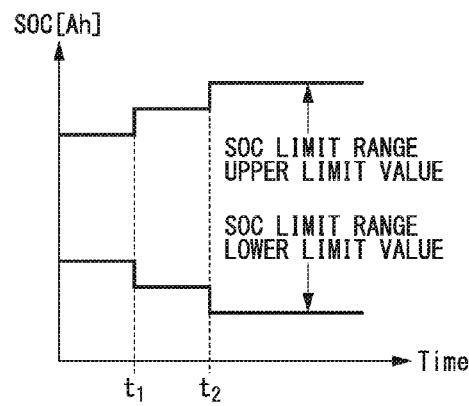
FIGS. 14A-14C are diagrams showing an example of selection of a SOC limit range according to the embodiment of the present invention.
Figure 14B:
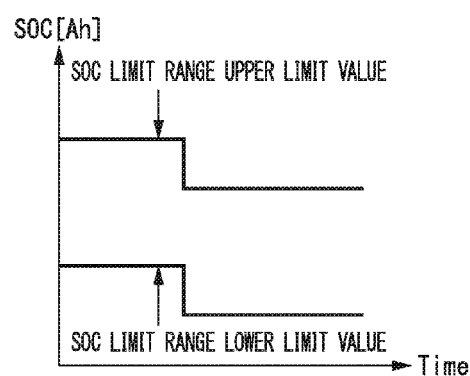

FIG. 14 is a diagram showing an example of selection of the SOC LIMIT RANGE. In FIG. 14 (A)-(C), a horizontal axis represents time (Time), and a vertical axis represents the SOC [Ah]. FIG. 14 (A) shows an enlargement in a plurality of stages. For example, the SOC LIMIT RANGE has two stages which are the SOC LIMIT RANGE at t1 and the SOC LIMIT RANGE at t2, and the SOC LIMIT RANGE at t2 is a setting that might promote a deterioration of the battery while the SOC LIMIT RANGE at t2 can be more expanding the residual time. The SOC LIMIT RANGE at t1 is used for the expansion of the residual time for replacing the batteries. However, when it has priority to continue to use the assembled battery in an emergency situation due to a disaster, it can operate such as using the SOC LIMIT RANGE at t2.

FIG. 14 (B) shows the moving of the SOC LIMIT RANGE to which the residual capacity is low. For example, in generally, because the lithium ion battery is that the higher the residual capacity, in other words, the higher the voltage, the larger the quantity of the self-discharge, if it can decrease the quantity of the self-discharge by moving the SOC LIMIT RANGE to the side to which the residual capacity is low, as compared with the case of high residual capacity, it is possible to enlarge the residual time by shortening the equalization time, or by loosening the spreading rate of the residual capacity difference.

Figure 14C:
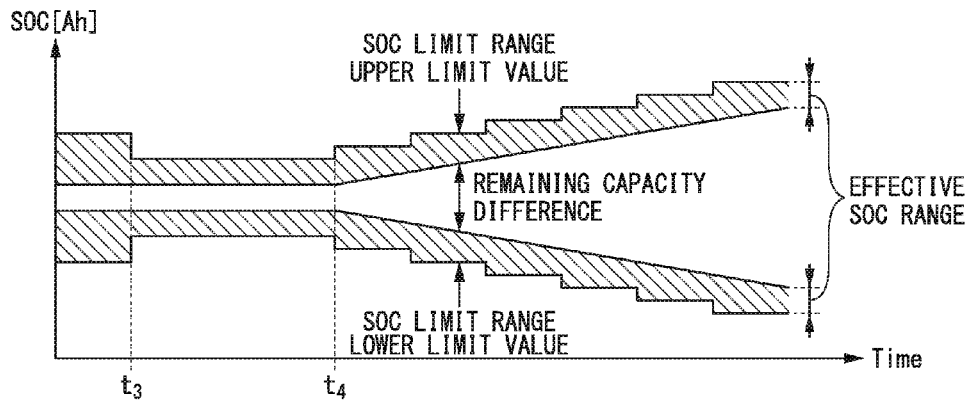

FIG. 14(C) shows a combination of expansion and contraction. For example, it is possible to reduce the SOC LIMIT RANGE at t3 which although the residual capacity equalization is capable, the self-discharge current difference is in the expansion trend. In this case, although the function of the assembled battery is limited since the effective SOC range is contracted, it is transited to the state of the operation in a range that the deterioration of the battery is not allowed to proceed. The SOC LIMIT RANGE is expanded to maintain the effective SOC range at t4 when it becomes impossible to equalize the residual capacity. Hereafter, the SOC LIMIT RANGE is expanded in response to the expansion of the residual capacity difference. The example can be used as a mechanism such that the duration of the inspection and maintenance is stretching as long as possible when the assembled battery is installed in a remote location where the inspection and the maintenance are difficult.

What is claimed is:

1. A power storage service system configured to control a power system using an assembled battery system including a plurality of battery cells, the plurality of battery cells including a first battery cell and a second battery cell, the power storage service system comprising:
    a residual capacity measurer configured to detect at least a residual capacity of the first battery cell and a residual capacity of the second battery cell;
    a first measurer configured to calculate a self-discharge current difference between the first battery cell and the second battery cell, on the basis of a first difference between the residual capacities of the first battery cell and the second battery cell detected by the residual capacity measurer at a first point in time and a second difference between the residual capacities of the first battery cell and the second battery cell detected by the residual capacity measurer at a second point in time, the second point in time being later than the first point in time, the self-discharge current difference being a difference between a self-discharge current occurring in the first battery cell and a self-discharge current occurring in the second battery cell; and
    a second measurer configured to obtain a residual time of the assembled battery using a difference between the residual capacities of the first battery cell and the second battery cell detected by the residual capacity measurer and the self-discharge current difference calculated by the first measurer.

2. The power storage service system according to claim 1, wherein the first measurer comprises:
    a residual capacity equalizer configured to reduce the residual capacity of the first battery cell by causing the first battery cell to discharge an equalization current;
    a time stamper configured to record at least an operation starting time, an operation ending time, and a measuring time of the residual capacity, of the residual capacity equalizer as a time stamp result;
a time stamp result storage configured to store the time stamp result recorded by the time stamper;
a current value detector configured to detect a current value of the equalization current as a residual capacity equalization current value and a current value of the assembled battery system;
a current value storage configured to store the residual capacity equalization current value obtained from the current value detector;
a first obtainer configured to obtain a equalization adjustment quantity for equalizing the residual capacity of the each of the battery cells using the residual capacity equalization current value obtained from the residual capacity measurer, the time stamp result stored in the time stamp result storage, and the residual capacity equalization current value stored in the current value storage; and
a second obtainer configure to obtain the self-discharge current difference from the residual capacity measurement value obtained from the residual capacity measurer, the time stamp result stored in the time stamp result storage, and the equalization adjustment quantity obtained from the first obtainer.

3. The power storage service system according to claim 2, further comprising:
a voltage measurer configured to measure a voltage of each of the battery cells;
wherein the residual capacity measurer detects the residual capacity of the battery cell by using a first differential characteristic curve of the voltage value of the battery cell measured by the voltage measurer and the current value of the assembled battery measured by the current detector, a second differential characteristic curve as a criterion, and an optimization function.

4. The power storage service system according to claim 2, wherein the first obtainer integrates the residual capacity equalization current value based on the operation starting time and the operation ending time stored in the time stamper.

5. The power storage service system according to claim 2, wherein the second obtainer obtains the self-discharge current difference based on a value obtained from the residual capacity of the battery cell measured by the residual capacity measurer by using a calculation method including at least a maximum value, a minimum value, an average value, and a multiplication of a coefficient.

6. The power storage service system according to claim 2, wherein the second obtainer obtains the self-discharge current difference based on the residual capacity of at least one battery cell obtained from the residual capacity measurer.

7. The power storage service system according to claim 2, further comprising:
a residual capacity limit value setter configured to set an upper limit value and a lower limit value of the residual capacity obtained from the residual capacity measurer; and
a residual capacity limiter configured to store the upper limit value and the lower limit value of the residual capacity measurement value set by the residual capacity limit value setter.

8. The power storage service system according to claim 2, wherein the second measurer comprises:
a third obtainer configured to obtain a time required for an additional operation of the residual capacity equalizer by using the self-discharge current difference, the residual capacity equalization current value, and the residual capacity, in a case where the self-discharge current difference obtained from the second obtainer is smaller than the residual capacity equalization current value stored in the current value storage; and
a fourth obtainer configured to obtain the residual time of the assembled battery system by using an SOC limit range, the self-discharge current difference, the residual capacity equalization current value, and the residual capacity, in a case where the self-discharge current difference is larger than the residual capacity equalization current value,
wherein the SOC limit range is a range of SOC in which each of the first and second battery cells is allowed to be charged or discharged.

9. The power storage service system according to claim 8, wherein the second measurer comprises:
a battery state value output unit configured to output a current state value indicating that the self-discharge current difference is expanding if a ratio of an absolute value of the self-discharge current difference to the residual capacity equalization current value is larger than or equal to a predetermined ratio.

10. The power storage service system according to claim 8, wherein the second measurer comprises:
a battery state value output unit configured to output a current state value indicating that the self-discharge current difference is normal if a ratio of an absolute value of the self-discharge current difference to the residual capacity equalization current value is smaller than a predetermined ratio.

11. The power storage service system according to claim 8, wherein the second measurer comprises:
a battery state value output unit configured to output a current state value indicating that a non-stationary maintenance service is required if the residual time obtained by the fourth obtainer is less than a residual time until a predetermined maintenance service time.

12. The power storage service system according to claim 7, wherein the residual capacity limiter decreases a residual capacity lower limit value based on a setting of the residual time expanding signal for expanding a time it takes for an effective SOC range of the assembled battery system to become zero, and
wherein the effective SOC range is obtained from a difference between an SOC limit range and a difference between the residual capacities of the first and second battery cells, the SOC limit range being a range of SOC in which each of the first and second battery cells is allowed to be charged or discharged.

13. The power storage service system according to claim 7, wherein the residual capacity limiter increases a residual capacity upper limit value based on a setting of the residual time expanding signal for expanding a time it takes for an effective SOC range of the assembled battery system to become zero, and
wherein the effective SOC range is obtained from a difference between an SOC limit range and a difference between the residual capacities of the first and second battery cells, the SOC limit range being a range of SOC in which each of the first and second battery cells is allowed to be charged or discharged.

14. The power storage service system according to claim 9, further comprising:
a device configured to change either the residual capacity lower limit value or the residual capacity upper limit value, or both of the residual capacity lower limit value and the residual capacity upper limit value based on a residual time expanding signal for expanding a time it takes for the effective SOC range of the assembled battery system to become zero, to re-obtain the residual time and update a battery state value, and wherein the effective SOC range is obtained from a difference between an SOC limit range and a difference between the residual capacities of the first and second battery cells, the SOC limit range being a range of SOC in which each of the first and second battery cells is allowed to be charged or discharged.

15. The power storage service system according to claim 1, further comprising:
 a physical quantity measurer configured to measure a temperature of the battery cell if a ratio of the self-discharge current difference measured by the first measurer to the equalization current value is larger than or equal to a predetermined ratio; and
 a first determiner configured to compare a temperature of the battery cell of which the self-discharge current difference is large with a temperature of the battery cell which is a criterion for obtaining the self-discharge current difference or an average temperature, to determine the temperature of the battery cell of which the self-discharge current difference is larger than the temperature of the battery cell which is the criterion or the average temperature, and to output a signal representing that a measurement of the self-discharge current difference is normal.

16. The power storage service system according to claim 1, wherein the first measurer comprises:
 a physical quantity measurer configured to measure a dilatation of the external form of the battery cell if a ratio of the self-discharge current difference to the equalization current value is larger than or equal to a predetermined ration;
 a first determiner configured to compare a dilatation of the battery cell of which the self-discharge current difference is large with a dilatation of the battery cell which is a criterion for obtaining the self-discharge current difference or an average dilatation, to determine the dilatation of the battery cell of which the self-discharge current difference is larger than the dilatation of the battery cell which is the criterion or the average dilatation, and to output a signal representing that a measurement of the self-discharge current difference is normal.

17. The power storage service system according to claim 1, wherein the first measurer comprises a display configured to display a measurement result trend of the self-discharge current difference.

18. The power storage service system according to claim 9, further comprising:
 a device configured to monitor remotely the current state value via a communication line including at least the internet.

19. The power storage service system according to claim 7, further comprising:
 a maintenance service business system configured to provide a residual time expanding signal for expanding a time it takes for the effective SOC range of the assembled battery system to become zero to the residual capacity limit value setter by using the battery state value, the residual time, the self-discharge current difference, and a physical quantity which is a physical quantity for detecting an abnormal state of the battery cell, to plan a maintenance schedule of the assembled battery, and to implement a maintenance operation.

* * * * *